United States Patent
Jiang et al.

(10) Patent No.: US 9,946,475 B2
(45) Date of Patent: Apr. 17, 2018

(54) JOINT REWRITING AND ERROR CORRECTION IN WRITE-ONCE MEMORIES

(71) Applicants: California Institute of Technology, Pasadena, CA (US); Texas A&M University System, College Station, TX (US)

(72) Inventors: Anxiao Jiang, College Station, TX (US); Yue Li, College Station, TX (US); Eyal En Gad, Pasadena, CA (US); Michael Langberg, Buffalo, NY (US); Jehoshua Bruck, Pasadena, CA (US)

(73) Assignee: CALIFORNIA INSTITUTE OF TECHNOLOGY, Pasadena, CA (US)

(*) Notice: Subject to any disclaimer, the term of this patent is extended or adjusted under 35 U.S.C. 154(b) by 139 days.

(21) Appl. No.: 14/443,349

(22) PCT Filed: Jul. 5, 2013

(86) PCT No.: PCT/US2013/049480
§ 371 (c)(1),
(2) Date: May 15, 2015

(87) PCT Pub. No.: WO2014/116301
PCT Pub. Date: Jul. 31, 2014

(65) Prior Publication Data
US 2015/0293716 A1    Oct. 15, 2015

Related U.S. Application Data

(60) Provisional application No. 61/756,324, filed on Jan. 24, 2013.

(51) Int. Cl.
*G06F 12/00*    (2006.01)
*G06F 13/00*    (2006.01)
(Continued)

(52) U.S. Cl.
CPC ............ *G06F 3/0619* (2013.01); *G06F 3/064* (2013.01); *G06F 3/0679* (2013.01);
(Continued)

(58) Field of Classification Search
CPC ............... G06F 3/0679; G06F 11/1012; G06F 11/1068; G06F 12/0246; G11C 11/5628; G11C 11/5642
(Continued)

(56) References Cited

U.S. PATENT DOCUMENTS

2001/0040836 A1* 11/2001 Mori ................ G11C 29/50004
365/240
2001/0055222 A1* 12/2001 Banks ................. G11C 11/5621
365/185.03
(Continued)

FOREIGN PATENT DOCUMENTS

WO    2011156745 A2    12/2011

OTHER PUBLICATIONS

Arikan, E., "Channel polarization: A method for constructing capacity-achieving codes for symmetric binary-input memoryless channels," IEEE Transactions on Information Theory, vol. 55, No. 7, pp. 3051-3073 (Jul. 20, 2009)
(Continued)

*Primary Examiner* — Charles Rones
*Assistant Examiner* — Sidney Li
(74) *Attorney, Agent, or Firm* — Turk IP Law, LLC

(57) ABSTRACT

Both rewriting and error correction are technologies usable for non-volatile memories, such as flash memories. A coding scheme is disclosed herein that combines rewriting and error correction for the write-once memory model. In some embodiments, code construction is based on polar codes, and supports any number of rewrites and corrects a substantial number of errors. The code may be analyzed for a binary
(Continued)

symmetric channel. The results can be extended to multi-level cells and more general noise models.

25 Claims, 15 Drawing Sheets

(51) Int. Cl.
 *G06F 13/28* (2006.01)
 *G06F 3/06* (2006.01)
 *H03M 13/13* (2006.01)
 *G11C 11/56* (2006.01)
 *G06F 11/10* (2006.01)
 *G06F 12/02* (2006.01)
 *G11C 17/14* (2006.01)
 *G11C 29/04* (2006.01)

(52) U.S. Cl.
 CPC ......... *G06F 11/1012* (2013.01); *H03M 13/13* (2013.01); *G06F 11/1068* (2013.01); *G06F 12/0246* (2013.01); *G11C 11/5628* (2013.01); *G11C 11/5642* (2013.01); *G11C 17/146* (2013.01); *G11C 2029/0411* (2013.01)

(58) Field of Classification Search
 USPC ...................................................... 711/154
 See application file for complete search history.

(56) References Cited

U.S. PATENT DOCUMENTS

| | | | |
|---|---|---|---|
| 2002/0136068 A1 | 9/2002 | Widdershoven | |
| 2002/0159410 A1* | 10/2002 | Odenwalder | H04L 1/0046 370/329 |
| 2004/0001408 A1 | 1/2004 | Propps et al. | |
| 2006/0279437 A1* | 12/2006 | Luby | H03M 13/1515 341/50 |
| 2008/0168215 A1* | 7/2008 | Jiang | G06F 11/1072 711/103 |
| 2008/0198652 A1* | 8/2008 | Shalvi | G11C 11/56 365/185.03 |

OTHER PUBLICATIONS

Bohossian, V., et al., "Buffer Coding for Asymmetric Multi-Level Memory," IEEE International Symposium on Information Theory, pp. 1186-1190 (Jun. 24-29, 2007).

Burshtein, D., and Strugaiski, A., "Polar write once memory codes," IEEE International Symposium on Information Theory Proceedings (ISIT), pp. 1972-1976 (Jul. 1-6 2012).

Cohen, G., et al., "Linear binary code for write-once memories," IEEE Transactions on Information Theory, vol. 32. No. 5, pp. 697-700 (Sep. 1986).

Gad, E.E., et al., "Rank-Modulation Rewriting Codes for Flash Memories," IEEE International Symposium on Information Theory Proceedings (ISIT), pp. 704-708 (Jul. 7-12, 2013).

Heegard, C., "On the capacity of permanent memory," IEEE Transactions on Information Theory, vol. 31, No. 1, pp. 34-42 (Jan. 1985).

International Search Report for International Application No. PCT/US2013/049480 dated Sep. 10, 2013.

Jiang, A., et al., "Floating Codes for Joint Information Storage in Write Asymmetric Memories," IEEE International Symposium on Information Theory, pp. 1166-1170 (Jun. 2007).

Korada, S.B., and Urbanke, R., "Polar Codes are Optimal for Lossy Source Coding," IEEE Transactions on Information Theory, vol. 56, No. 4, pp. 1751-1768 (Apr. 2010)

Kurkoski, B.M., "Lattices for Error Correction and Rewriting in Flash Memories," accessed at http://www.jaist.ac.jp/~kurkoski/papers/conf/Kurkoski-nvmw11.pdf, accessed on Mar. 19, 2015, pp. 1-4.

Merkx, F., "Womcodes constructed with projective geometries," Traitement du Signal, vol. 1, No. 2-2, pp. 227-231 (Jan. 1984).

Mohammed, S.A., "Coding Techniques for Error Correction and Rewriting in Flash Memories," Master's thesis, Texas A&M University, pp. 1-42 (Aug. 2010).

Rivest, R.L., and Shamir, A., "How to reuse a write-once memory," Information and Control, vol. 55, No. 1-3, pp. 1-19 (Oct.-Dec. 1982).

Shpilka, A., "Capacity Achieving Multiwrite WOM codes," IEEE Transactions on Information Theory, vol. 60, No. 3, pp. 1481-1487 (Mar. 3, 2014).

Shpilka, A., "Capacity Achieving Two-Write WOM Codes," Latin 2012: Theoretical Informatics Lecture Notes in Computer Science, vol. 7256, pp. 631-642 (Apr. 2012).

Tal, I., and Vardy, A., "How to Construct Polar Codes," IEEE Transactions on Information Theory, vol. 59, No. 10, pp. 6562-6582 (Jul. 10, 2013).

Wu, Y., "Low complexity codes for writing a write-once memory twice," IEEE International Symposium on Information Theory Proceedings (ISIT), pp. 1928-1932 (Jun. 2010).

Wu, Y., and Jiang, A., "Position Modulation Code for Rewriting Write-Once Memories," IEEE Transactions on Information Theory, vol. 57, No. 6, pp. 3692-3697 (Jun. 2011).

Yaakobi, E., and Shpilka, A., "High Sum-Rate Three-Write and Non-Binary WOM Codes," 2012 IEEE International Symposium on Information Theory Proceedings, pp. 1386-1390 (Jul. 1-6, 2012).

Yaakobi, E., et al., "Codes for Write-Once Memories," IEEE Transactions on Information Theory, vol. 58 No. 9, pp. 5985-5999 (Sep. 2012).

Yaakobi, E., et al., "Efficient Two-Write WOM-Codes," 2010 IEEE Information Theory Workshop, pp. 1-5 (Aug. 30, 2010-Sep. 3, 2010).

Yaakobi, E., et al., "Error Characterization and Coding Schemes for Flash Memories," IEEE GLOBECOM Workshops (GC Wkshps), pp. 1856-1860 (Dec. 6-10, 2010)

Yaakobi, E., et al., "Muitiple Error-Correcting WOM-Codes," IEEE Transactions on Information Theory, vol. 58, No. 4, pp. 2220-2230 (Apr. 2012).

Zémor, G., and Cohen, G.D., "Error-correcting WOM-codes," IEEE Transactions on Information Theory, vol. 37, No. 3, pp. 730-734 (May 1991).

\* cited by examiner

JOINT REWRITING AND ERROR CORRECTION IN WRITE-ONCE MEMORIES

CROSS-REFERENCE TO RELATED APPLICATIONS

This Application is the U.S. National Stage filing under 35 U.S.C. § 371 of International Application No. PCT/US/13/49480, filed on Jul. 5, 2013, which claims the benefit under 35 U.S.C. § 119(e) of U.S. Provisional Application No. 61/756,324, filed on Jan. 24, 2013. The International Application and the U.S. Provisional Application are herein incorporated by reference in their entireties.

STATEMENT REGARDING GOVERNMENT SPONSORED RESEARCH AND DEVELOPMENT

The invention was made with government support under Grant No. CIF1218005 awarded by the National Science Foundation. The government has certain rights in the invention.

TECHNICAL FIELD

The field generally relates to unidirectional or write only memories (WOM), which have cells which may be individually changed in a single direction, but are erased as a group, and more specifically but not exclusively to rewriting write only memories with error correction.

BACKGROUND

Unless otherwise indicated herein, the materials described in this section are not prior art to the claims in this application and are not admitted to be prior art by inclusion in this section.

Coding for rewriting is a technology used for flash memories. Coding has the potential to substantially increase the longevity, speed, and power efficiency of flash memories. Coding for rewriting has been proposed recently. See, e.g. V. Bohossian, A. Jiang, and J. Bruck, "Buffer coding for asymmetric multi-level memory," in *Proc. IEEE Internatio. Nal Symposium on Information Theory*, June 2007, pp. 1186-1190, and A. Jiang, V. Bohossian, and J. Bruck, "Floating codes for joint information storage in write asymmetric memories," in *Proc. IEEE International Symposium on Information Theory*, June 2007, pp. 1166-1170, which are incorporated herein by reference. Since the time coding was initially proposed, many works have appeared in this area. See, e.g. Y. Wu, "Low complexity codes for writing a write-once memory twice," in *Proc. IEEE International Symposium on Information Theory*, June 2010, pp. 1928-1932, Y. Wu and A. Jiang, "Position modulation code for rewriting write-once memories," *IEEE Trans. Inf. Theor.*, vol. 57, no. 6, pp. 3692-3697, June 2011, E. Yaakobi, S. Kayser, P. H. Siegel, A. Vardy, and J. K. Wolf, "Codes for write-once memories," *IEEE Trans. Inf. Theor.*, vol. 58, no. 9, pp. 5985-5999, September 2012, and E. Yaakobi, S. Kayser, P. Siegel, A. Vardy, and J. Wolf, "Efficient two-write wom-codes," in *Proc. IEEE Information Theory Workshop*, September 2010, pp. 1-5, which are incorporated herein by reference.

A model for rewriting is a write-once memory (WOM) model. See. e.g. R. L. Rivest and A. Shamir, "How to reuse a write-once memory," *Information and Control*, vol. 55, no. 1-3, pp. 1-19, 1982, which is incorporated herein by reference. In the WOM model, a set of binary cells are used to store data, and the cell charge levels are increased when the data are rewritten. For flash memories, this constraint implies that the rewriting operation may delay the expensive block erasure, which leads to better preservation of cell quality and higher writing performance.

There have been many techniques for the design of WOM codes. They include linear code, tabular code, codes based on projective geometry, coset coding, etc. See, e.g. G. Cohen, P. Godlewski, and F. Merkx, "Linear binary code for write-once memories," *IEEE Trans. Inf. Theor.*, vol. 32, no. 5, pp. 697-700, September 1986, Merkx, "Womcodes constructed with projective geometries" *Traitement du Signal*, vol. 1, no. 2-2, pp. 227-231, 1984, and R. L. Rivest and A. Shamir, "How to reuse a write-once memory," *Information and Control*, vol. 55, no. 1-3, pp. 1-19, 1982, which are incorporated herein by reference. Codes with substantially higher rates were discovered in recent years. See, e.g. V. Bohossian, A. Jiang, and J. Bruck, "Buffer coding for asymmetric multi-level memory," in *Proc. IEEE International Symposium on Information Theory*, June 2007, pp. 1186-1190, and A. Jiang, V. Bohossian, and J. Bruck, "Floating codes for joint information storage in write asymmetric memories," in *Proc. IEEE International Symposium on Information Theory*, June 2007, pp. 1166-1170, which are incorporated herein by references. Since the time such coding was initially proposed, many works have appeared in this area. See, e.g. Y. Wu, "Low complexity codes for writing a write-once memory twice," in *Proc. IEEE International Symposium on Information Theory*, June 2010, pp. 1928-1 2, E. Yaakobi, S. Kayser, P. H. Siegel, A. Vardy, and J. K. Wolf, "Codes for write-once memories," *IEEE Trans. Inf. Theor.*, vol. 58, no. 9, pp. 5985-5999, September 2012, which are incorporated herein by reference. In 2012, WOM codes that achieved capacity were discovered by Shpilka et al. and Burshtein et al. See, e.g. A. Shpilka, "Capacity achieving multiwrite wom codes," CoRR, vol. abs/1207.1128, 2012, "Capacity achieving two-write wom codes," in LATIN 2012: *Theoretical Informatics*, ser. Lecture Notes in Computer Science, vol. 7256. Springer Berlin Heidelberg, 2012, pp. 631-642, E. Yaakobi and A. Shpilka, "High sum-rate three-write and non-binary wom codes," in *Proc. IEEE International Symposium on Information Theory*, July 2012, pp. 1386-1390, and D. Burshtein and A. Strugatski, "Polar write once memory codes," in Proc. IEEE International Symposium on Information Theory, July 2012, pp. 1972-1976, which are incorporated herein by reference. The latter code used a construction based on polar coding.

Compared to the large amount of work on WOM codes, the work on WOM codes that also correct errors has been much more limited. Existing works are mainly on correcting a few errors (for example, 1, 2, or 3 errors). See, e.g. E. Yaakobi, P. Siegel, A. Vardy, and J. Wolf, "Multiple error-correcting wom-codes," *IEEE Trans. Inf. Theor.*, vol. 58, no. 4, pp. 2220-2230, April 2012, and G. Zemor and G. D. Cohen, "Error-correcting wom-codes," *IEEE Trans. Inf. Theor.*, vol. 37, no. 3, pp. 730-734, May 1991, which are incorporated herein by reference.

SUMMARY

Coding schemes that combine rewriting with error correction are discussed. In some embodiments, the schemes may support any number of rewrites and can correct a substantial number of errors. The code construction may use polar coding. In some embodiments, an analytical technique may be used which is based on frozen sets corresponding to the WOM channel and the error channel, respectively, including their common degrading and common upgrading channels. In some embodiments, lower bounds to the sum-rate may be achieved. The actual sum-rates may be further computed for various parameters. The analytical technique may focus on the binary symmetric channel (BSC). In practice, for relatively small error probabilities, the frozen set for BSC may be often contained in the frozen set for the WOM channel, which enables some embodiments to have a nested structure. The coding scheme can be further extended to multi-level cells (MLC) and more general noise models.

One aspect is a method of rewriting a memory. The method includes determining a current cell charge level of each of a plurality of cells of the memory, and generating a plurality of next cell charge levels according to a linear transformation, where each next cell charge level is generated based on a corresponding one of the current cell charge levels and based on input data. Each next cell charge level is greater than or equal to the corresponding current cell charge level, the plurality of next cell charge levels represent the input data, and the plurality of next cell charge levels include redundancy for error correction. The method also includes storing the next cell charge levels in the memory.

Another aspect is a method of reading a memory. The method includes determining current cell charge levels of a plurality of cells of the memory, where the current cell charge levels represent data and error correction information. The method also includes generating a plurality of data values, where the data values are generated based on a linear transformation of the current cell charge levels, and transmitting the data values to a data destination.

Another aspect is a memory system. The system includes a memory that includes a plurality of cells, a processor coupled to the memory and configured to determine current cell charge levels of the plurality of cells of the memory, and an encoder coupled to the memory and to the processor, and configured to generate a plurality of next cell charge levels according to a linear transformation, where each next cell charge level is generated based on a corresponding one of the current cell charge levels and based on input data. Each next cell charge level is greater than or equal to the corresponding previous cell charge level, the plurality of next cell charge levels represent the input data, and the plurality of next cell charge levels include redundancy for error correction. The system also includes a write device, configured to store the next cell charge levels in the memory.

Another aspect is a memory system. The system includes a memory that includes a plurality of cells, a processor coupled to the memory and configured to determine current cell charge levels of the plurality of cells of the memory, where the current cell charge levels represent data and error correction information. The system also includes a decoder coupled to the processor and to the memory, and configured to generate a plurality of data values, where the data values are generated based on a linear transformation of the current cell charge levels. The system also includes a transmitter coupled the decoder and configured to transmit the data values to a data destination.

The foregoing summary is illustrative and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. illustrates an example of: Degrading channel $$WOM\left(\alpha, \frac{p}{\alpha}\right)$$

to WOM($\alpha,\varepsilon$). Here $$z = \frac{\alpha\varepsilon - p}{\alpha - 2p}.$$

The two channels on the left and on the right may be equivalent.

Figure 10:
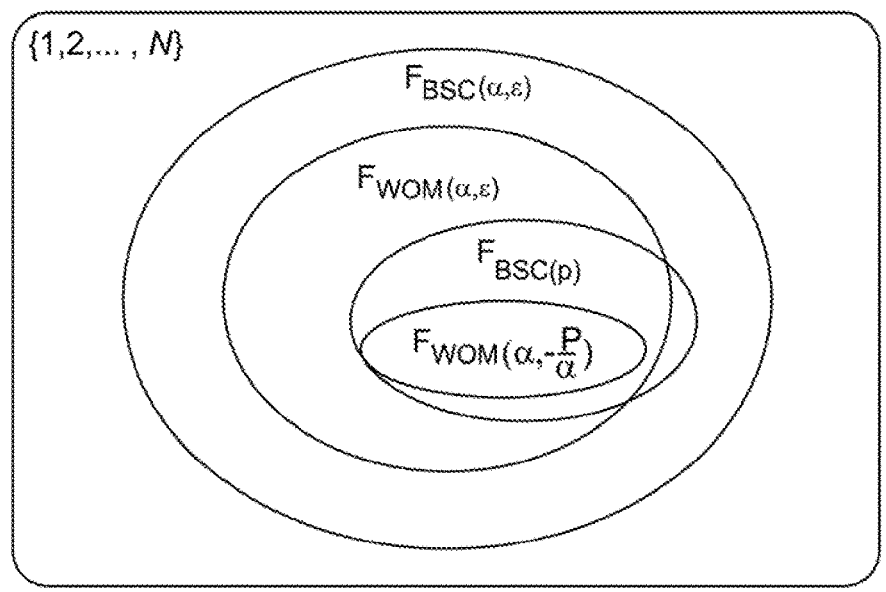

FIG. 10 illustrates an example of: The frozen sets for channels BSC(p), WOM($\alpha,\varepsilon$), $$WOM\left(\alpha, \frac{p}{\alpha}\right)$$

and BSC($\alpha\varepsilon$). Here p≤$\alpha\varepsilon$.

Figure 11:
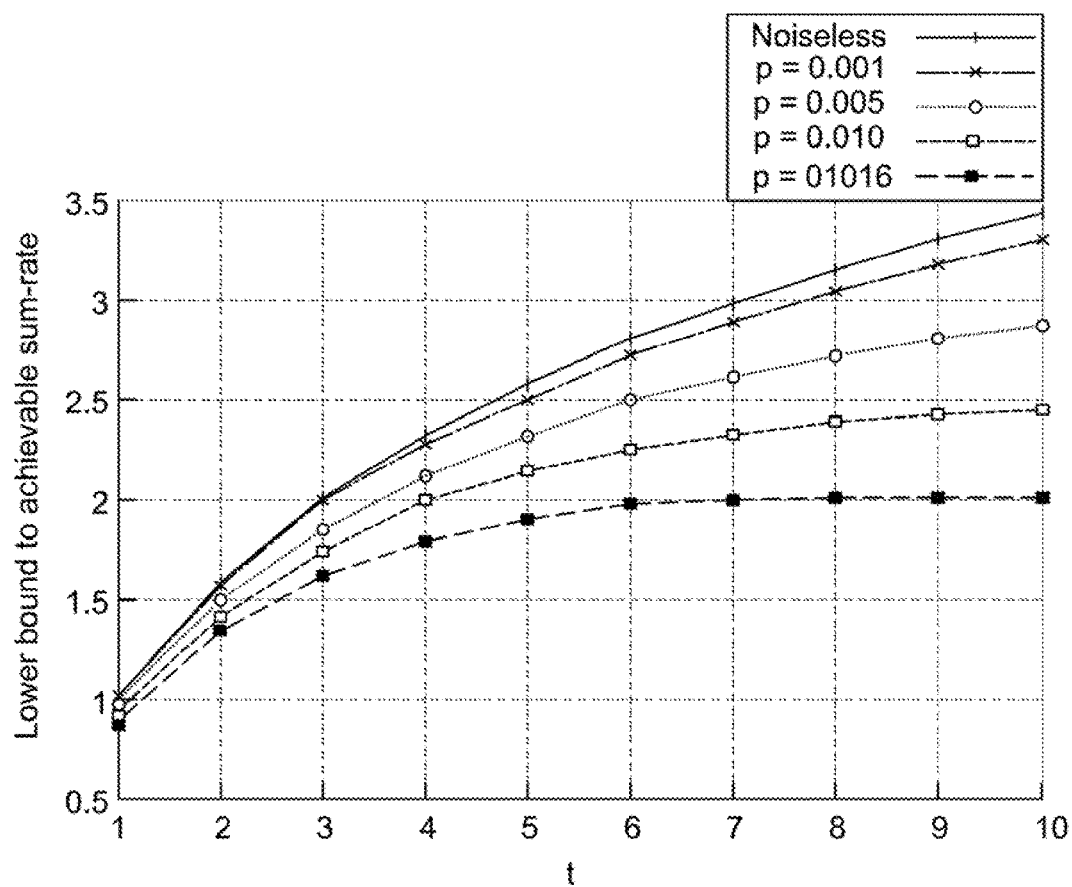

FIG. 11 is a graph illustrating an example of: Lower bound to achievable sum-rates for different error probability p.

Figure 12:
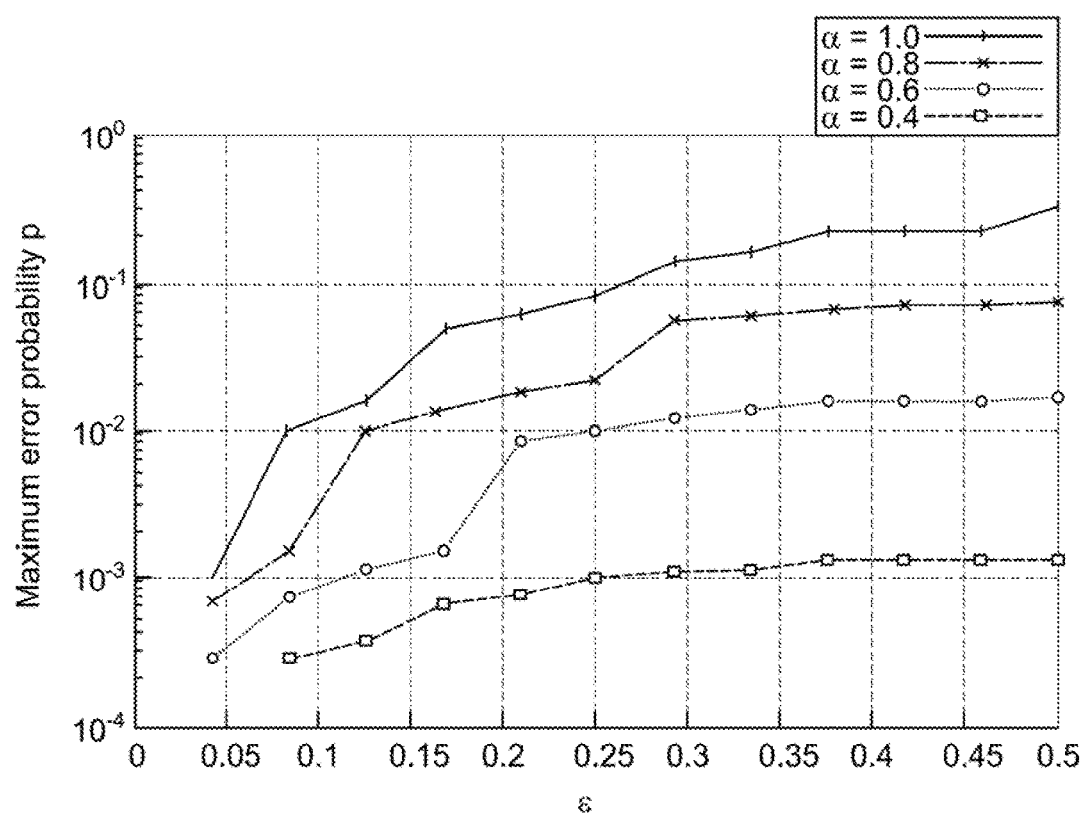

FIG. 12 is a graph illustrating an example of: The maximum value of p found for which $F_{BSC(p)} \subseteq F_{WOM(\alpha,\varepsilon)}$.

Figure 13:
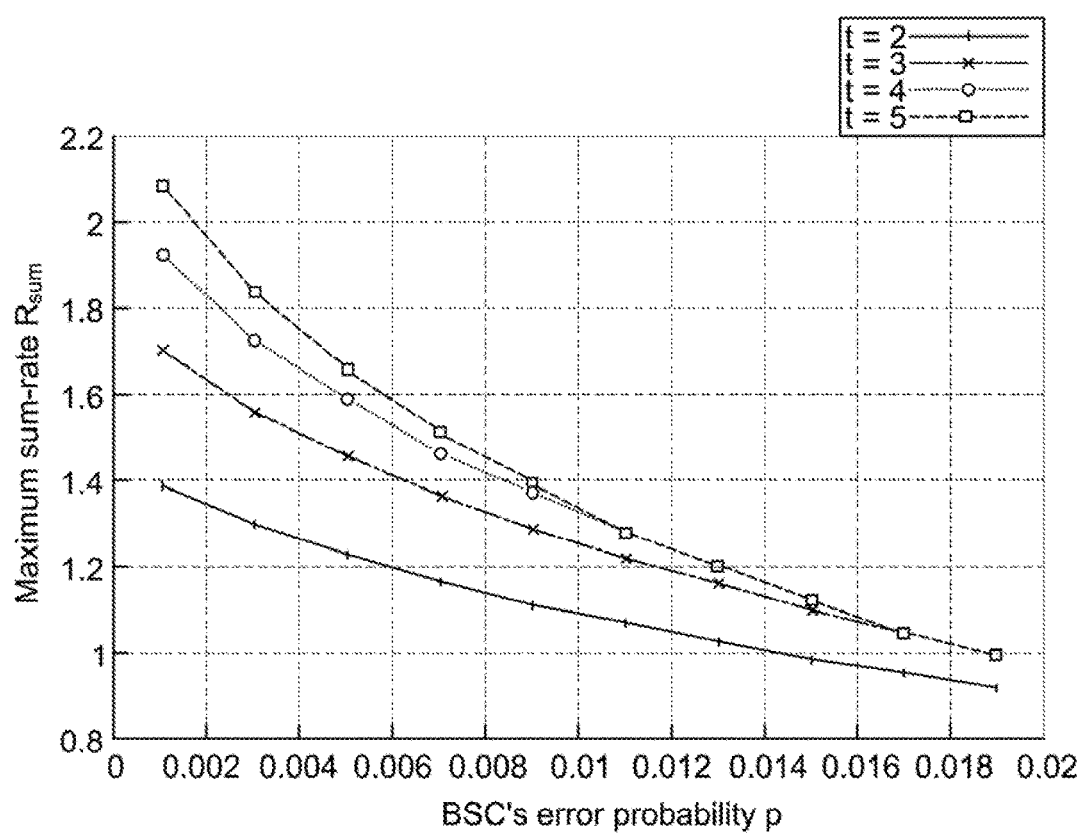

FIG. 13 is a graph illustrating an example of: Sum-rates for different t obtained in experimental search using code length N=8192, when $F_{BSC(p)} \subseteq F_{WOM(\alpha,\varepsilon)}$.

Figure 14:
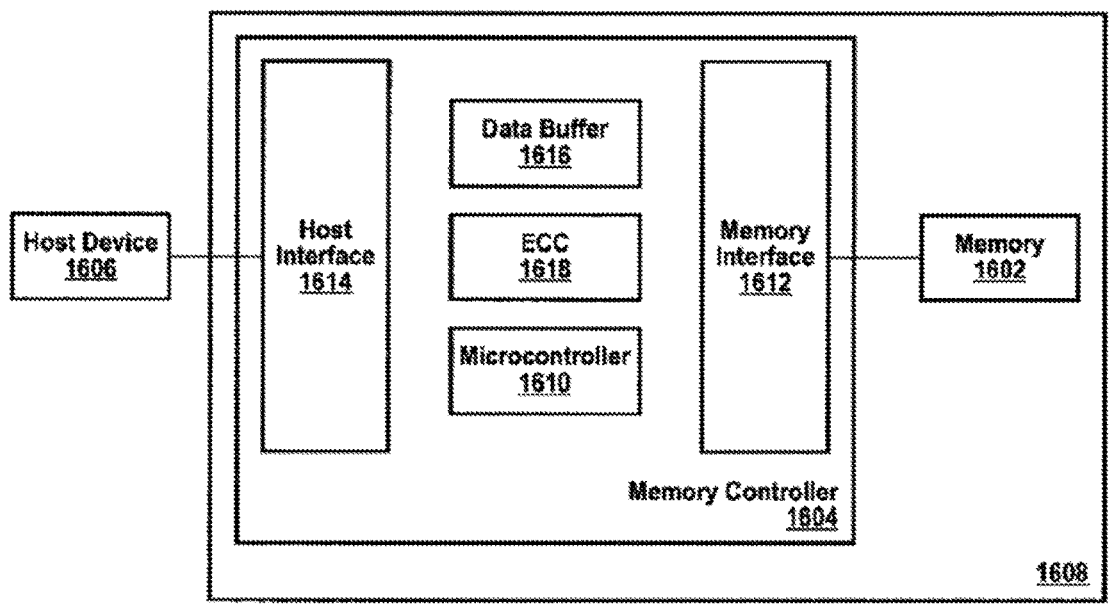

FIG. 14 is an illustration of an example memory device.

Figure 15:
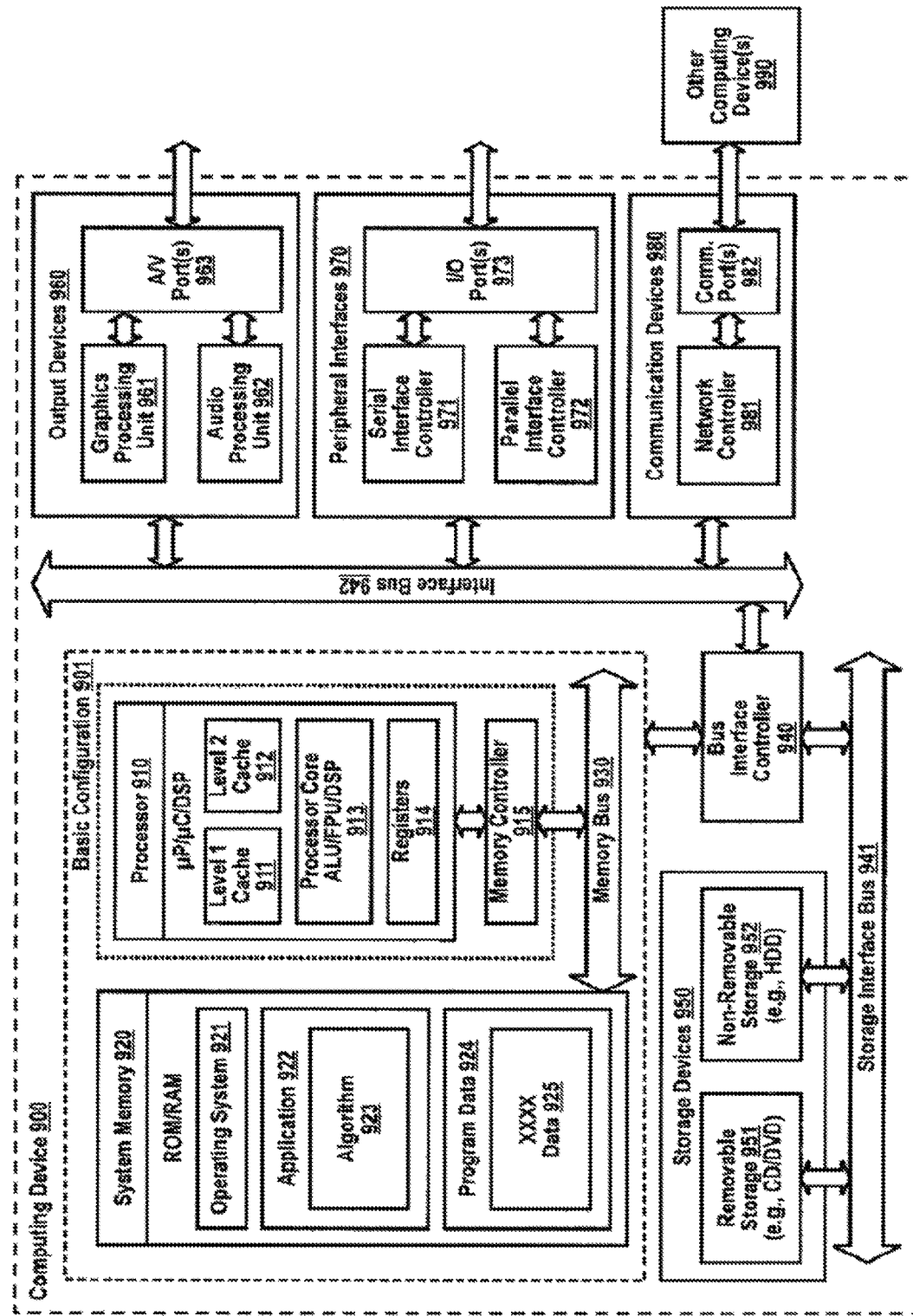

FIG. 15 is a block diagram of an example computing device for communicating or otherwise operating with a memory device such as depicted in FIG. 14.

Figure 16:
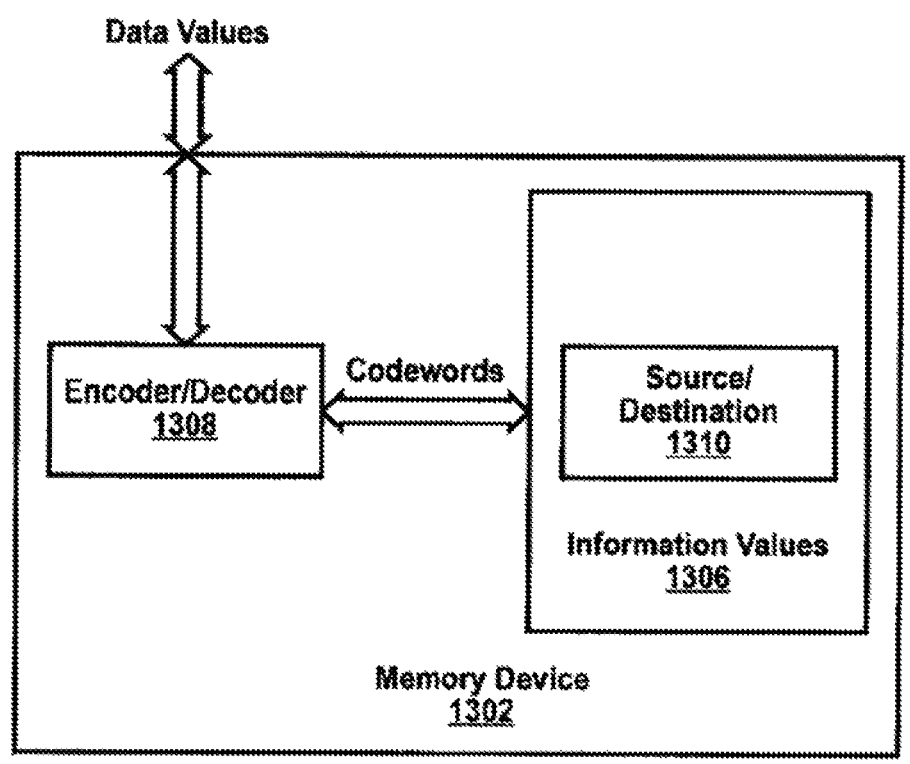

FIG. 16 is a block diagram that illustrates an example data flow in a system that operates according to aspects discussed herein.

All of the aspects and other features shown in the drawings are arranged according to at least some embodiments presented herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus, systems, devices, and computer program products related to joint rewriting and error correction in write-once memories.

Briefly stated, both rewriting and error correction are technologies that may be used for non-volatile memories, such as flash memories. This disclosure presents a coding scheme that combines rewriting and error correction for the write-once memory model. In some embodiments, code construction is based on polar codes, and supports any number of rewrites and corrects a substantial number of errors. The code may be analyzed for a binary symmetric channel. The results can be extended to multi-level cells and more general noise models.

I. Introduction

This disclosure presents a code construction for error-correcting WOM codes. The code construction scheme may support any number of rewrites and can correct a substantial number of errors.

For example, a memory may have N binary cells, where every cell has two charge levels: 0 and 1. The cell-programming method can only change a cell from 0 to 1, but not from 1 to 0. However, noise can change a cell in both directions: from 0 to 1, and from 1 to 0.

The coding for the cell programming has two functions: (1) Rewrite data, which means to store new data that replace old data, and (2) Correct errors. In some embodiments, a coding method may support t writes, where each write is also called a rewrite, and where t is an integer parameter greater than or equal to two.

After a write of data, noise may appear in the cell levels, and certain embodiments of cell programming can correct errors and recover the data stored by the latest write. In some embodiments, each of the writes may use substantially the same process.

As an example, let $(s_1, s_2, \ldots, s_N)$ be a binary vector that represent the levels of the N binary cells before a write. Let $(s'_1, s'_2, \ldots, s'_N)$ be a binary vector that represent cell levels of the N binary cells after this write. In addition, let $(b_1, b_2, \ldots, b_M)$ be a binary vector that represents the data to be written, where the data has M bits. Note the following constraints or conditions:

1) For $i=1, 2, \ldots, N$, $s'_i$ is greater than or equal to $s_i$. This is because the cell-programming method increases a cell's level, but may not decrease it.

2) M is an integer parameter known to the system. Its value can be the same or different for the writes.

3) The cell levels $(s_1, s_2, \ldots, s_N)$ can be different from the cell levels right after the previous rewrite, because noise may have changed the cell levels since the previous rewrite.

To write the data $(b_1, b_2, \ldots, b_M)$, the method may have the following inputs:

(1) The current cell levels $(s_1, s_2, \ldots, s_N)$, and
(2) The new data to store $(b_1, b_2, \ldots, b_M)$.

Based on the inputs from (1) and (2), the method computes the output $(s'_1, s'_2, \ldots, s'_N)$, and programs the cells to the new levels with the following constraints:

1) For $i=1, 2, \ldots, N$, $s'_i$ is greater than or equal to $s_i$.
2) The new cell levels $(s'_1, s'_2, \ldots, s'_N)$ represents the new data $(b_1, b_2, \ldots, b_M)$, according to the mapping specified by the method.

Figure 1:
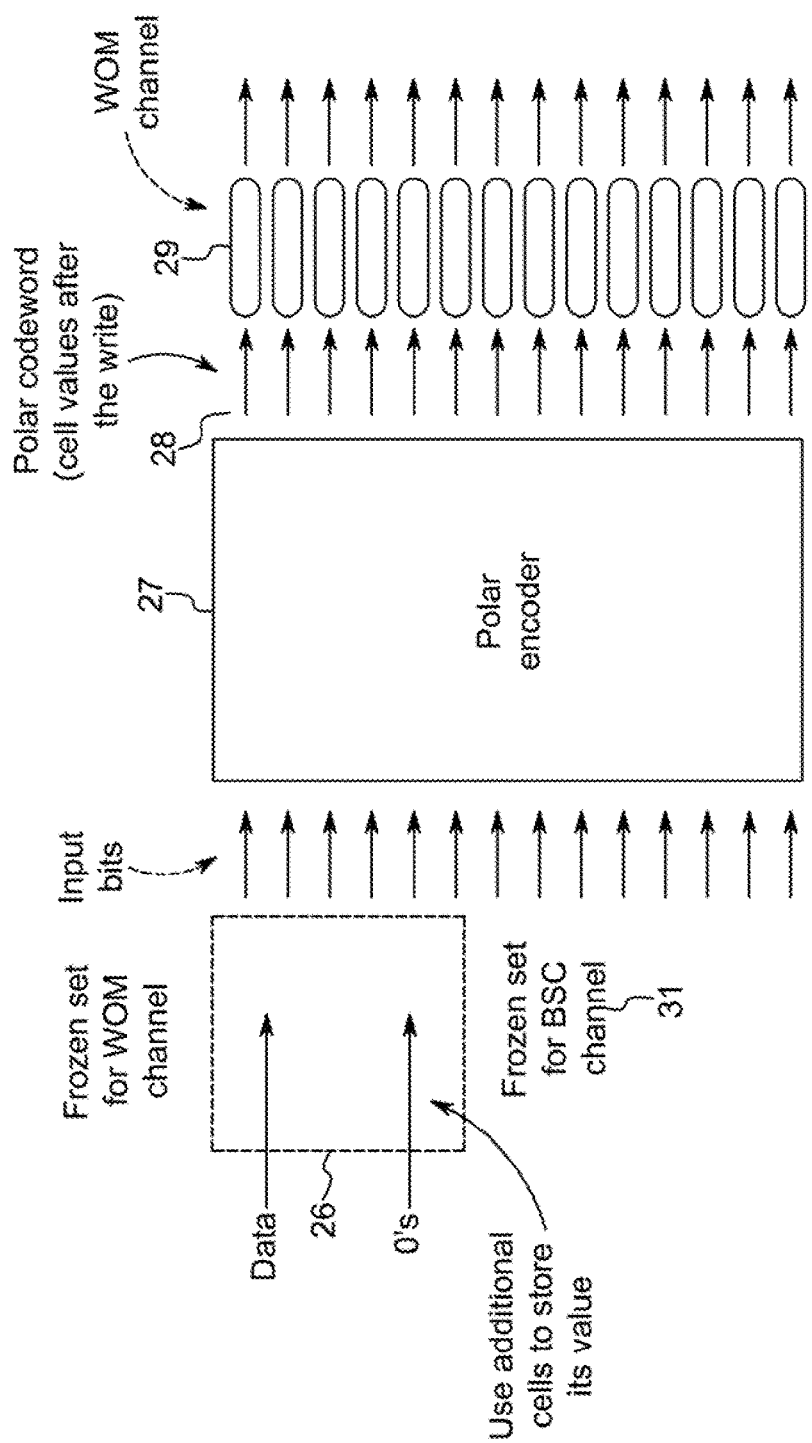
FIG. 1 is a block diagram illustrating an example write process.

FIG. 1 is a block diagram illustrating an example write process in accordance with some embodiments. The write process of FIG. 1 includes error correction, for example, as described above. Data to be stored in the memory is included with the frozen set for WOM channel 26, and is provided to the polar encoder 27. The polar encoder 27 generates a polar codeword 28, which is provided to a set of WOM channel device 29. The WOM channel devices 29 determine cell levels to be written into the WOM.

Data to be stored in the memory is included with the frozen set for WOM channel 26, and data of the frozen set for WOM channel 26 is provided to the polar encoder 27. In addition, additional data 31 is provided to the polar encoder 27. In the embodiment of FIG. 1, the additional data 31 is a frozen set for a binary symmetric channel (BSC) channel. The polar encoder 27 generates the polar codeword 28 based on the data of the frozen set for WOM channel 26 and the additional data 31 of the frozen set for the BSC channel. The additional data 31 allows for the polar encoder 27 to generate a polar codeword 28 which includes data for error correction. The poplar encoder 27 generates the polar codeword 28 according to embodiments and example features of encoding schemes discussed in further detail below. As discussed below, the encoding schemes allow for the WOM to be written with error correction.

The polar codeword 28 is provided to a set of WOM channel devices 29, which determine cell levels to be written into the WOM. The WOM channel devices 29 determine the cell levels such that the new state of the WOM includes the data of the frozen set and such that the only cell level changes in the WOM are from the 0 state to the 1 state. Embodiments of WOM channel devices are described below in further detail.

Figure 2:
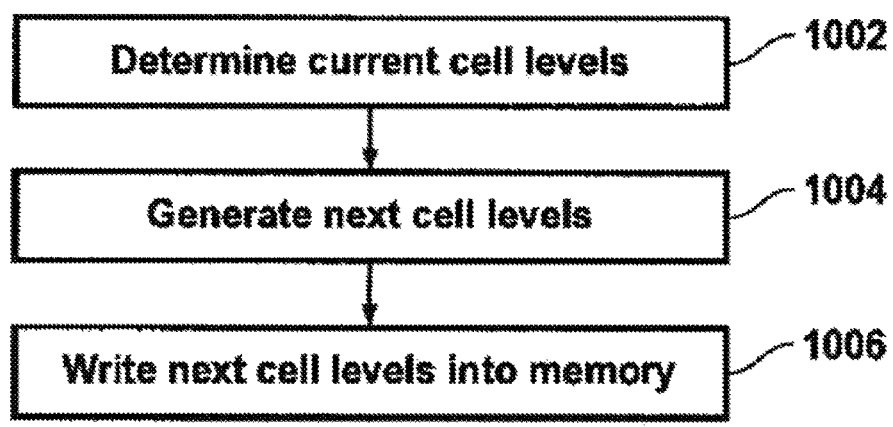
FIG. 2 is a flow diagram that shows example operations performed by a device for encoding a data value in a WOM rewrite process.

FIG. 2 is a flow diagram that shows example operations of a method that may be performed by a device for encoding a data value to be encoded into a codeword for rewriting the WOM in accordance with some embodiments. The device may comprise an external data storage device such as a flash memory device that receives data from a host device, such as a computer, and stores the data in accordance with error correction encoding schemes discussed below. For example, the device may comprise an encoder for the purpose of processing data values and producing corresponding codewords.

The method of FIG. 2 may include one or more operations, functions, or actions as illustrated by one or more of blocks 1002, 1004, and/or 1006. Although the blocks are illustrated in a sequential order, these blocks may also be performed in parallel, and/or in a different order than those described herein. Also, the various blocks may be combined into fewer blocks, divided into additional blocks, and/or eliminated based upon the particular implementation. Additional blocks may be provided that represent other operations, functions, or actions.

The method shown in FIG. 2 may begin in block 1002 "determine current cell levels." Block 1002 may be followed by block 1004 "generate next cell levels," and block 1004 may be followed by block 1006 "write next cell levels into memory."

In the first operation, represented by the flow diagram block 1002, current cell charge levels are determined. As discussed above, writing data into memory causes cell levels to change unidirectionally, for example, 0 to 1, but not 1 to 0. Accordingly, to determine which memory cells to change from 0 to 1, the current cell levels are determined.

In the next encoding operation, indicated by block 1004, next cell charge levels are generated based on the data to be written and on the current cell levels. Examples of techniques for determining next cell levels are discussed in further detail below. At block 1006, the next cell charge levels are written into the memory. For example, the next cell levels may be stored into memory cells of a data device, or maybe provided to a memory of a host device, or may be transmitted to an external destination.

As a result, the rewriting method enable new data to be stored in cells (to replace old data) two or more times without decreasing cell levels. In addition, an error correction method enables the most recently written data to be recovered even though noise may have changed the levels of some of the cells.

In particular, the rewriting operation takes the current cell levels (s1, . . . , sN) and the new data (b1, . . . , bM) as input, and computes new cell levels (s'1, . . . , s'N), where For i=1, . . . , N, s'i is greater than or equal to si. In addition, the new cell-level vector (s'1, . . . , s'N) represents the new data (b1, b2, . . . , bM), according to the mapping specified by the method. Accordingly, given the new cell levels (s'1, . . . , s'N), the decoding algorithm can uniquely determine the value of the new data (b1, . . . , bM).)

In some embodiments, to generate the next cell levels such as in block 1004, the method may use a binary matrix $A_{N \times N}=(a_{i,j})_{N \times N}$ of N rows and N columns, whose value is fixed and known to the system. For example, for i=1, . . . , N and j=1, . . . , N, $a_{i,j} \in \{0,1\}$ is the bit in the i-th row and j-th column of the matrix $A_{N \times N}$. Furthermore, the method may use a subset of $\{1, 2, \ldots, N\}$ denoted by FWOM, and another subset of $\{1, 2, \ldots, N\}$ denoted by FC to generate the next cell levels, such that:

FC contains at least one element. That is, |FC| is greater than or equal to 1,

There are M elements in FWOM but not in FC, that is, |FWOM−FC|=M,

At least one element of $\{1, 2, \ldots, N\}$ is neither in FWOM nor in FC. That is, $|\{1, 2, \ldots, N\}-$FWOM$-$FC$|$ is greater than or equal to 1.

FC is a subset of FWOM. That is, FC∈FWOM.

Furthermore, in some embodiments, to generate the next cell levels, the method may use a binary vector (g1, g2, : : : , gN) called a dither, whose value is known to the system. The value of the dither can be the same or different for each of the rewrites. Two other binary vectors (v1, v2, . . . , vN) and (v'1, v'2, . . . , v'N) may be determined as follows:

For i=1, . . . , N, vi=si⊕gi is called the value of the i-th cell before the write. Here ⊕ is the exclusive-OR operation.

For i=1, . . . , N, v'i=s'i⊕gi is called the value of the i-th cell after the write.

Furthermore, let $A^{-1}_{N \times N}$ be the inverse of the matrix $A_{N \times N}$, and let (u1, u2, . . . , uN) be the binary vector (u1, u2, . . . , uN)=(v'1, v'2, . . . , v'N) $A^{-1}_{N \times N}$. In addition, the vector (u1, u2, . . . , uN) may have the following properties:

The value of the bits $\{u_i | 1 \le i \le N, i \in F_{WOM}-F_C\}$—namely those bits in (u1, . . . , uN) whose indices are in FWOM FC—equals the value of the data (b1, ,bM).

The value of the bits $\{u_i | i \in F_C\}$ is a constant (such as all 0s or any other fixed value) known to the system.

The value of the bits $\{u_i | 1 \le i \le N, i \notin FWOM-FC\}$ is computed by the method for rewriting.

In some embodiments, the number of cells whose levels are change from 0 to 1 by the rewriting method is minimized or otherwise reduced. Accordingly, the method may minimize or otherwise reduce the value of $\Sigma_{i=1}^{N} s'_i - s_i$.

In some embodiments, the method may use the following $1^{st}$ probabilistic model to describe the relationship between cell levels (s1, . . . , sN) and (s'1, . . . s'N). Let $$\alpha = 1 - \sum_{i=1}^{N} \frac{S_i}{N},$$

and let $\epsilon \in [0, 1]$ be a real-number parameter whose value is known to the system. For i=1, . . . , N, $$Pr\{S_i = 0 \mid s'_i = 0\} = 1, \text{ and}$$

$$Pr\{S_i = 1 \mid \hat{S}_i = 0\} = 0.$$

$$Pr\{s_i = 0 \mid s'_i = 1\} = \frac{\alpha \varepsilon}{\alpha \varepsilon + 1 - \alpha}, \text{ and}$$

$$Pr\{s = 1 \mid s'_i = 1\} = \frac{1 - \alpha}{\alpha \varepsilon + 1 - \alpha}.$$

In some embodiments, the method may use the new cell levels (s'1, . . . , s'N) as the vector that maximizes or otherwise increases the value Pr{(s'1, . . . , s'N)|(s1, . . . , sN)}.

In some embodiments, the method may choose the new cell levels (s'1, . . . , s'N) as the vector that maximizes or otherwise increases the value Pr{(s1, . . . , sN)|(s'1, . . . , s'N)}.

In some embodiments, to generate the next cell levels, the method may compute the value of bits u1, u2, . . . , uN sequentially, and subsequently computes the value of cell levels (s'1, . . . , s'N) as (s'1, . . . , s'N)=(v'1, . . . , v'N)⊕(g1, . . . , gN)=(u2, . . . , uN)·$A^{-1}_{N \times N}$⊕(g1, . . . , gN). For i=1, . . . , N, the method computes the following:

1: If $i \in F_{WOM}-F_C$ and i is the j-th element in $F_{WOM}-F_C$ (for $j \in \{1, 2, \ldots, M\}$), let $u_i = b_j$ (the j-th bit in the new data). Otherwise, go to step 2.

2. If $i \in F_C$, let $\mu_i$ be the constant value specified previously (such as the value 0). Otherwise, go to step 3.

3. If $i \in \{1, 2, \ldots, N\}-F_{WOM}$, let $\mu_i$ take the value that maximizes the value of $Pr\{v_2|(v_1, v_1), \ldots, (s_N, v_N), \mu_1, \ldots, \mu_{i-1}\}$ assuming that each of $\mu_{i+1}, \ldots, \mu_N$ is equally likely to be 0 and 1.

In some embodiments, the method may use the following $2^{nd}$ probabilistic model to describe the relationship between vectors (v'1, . . . , v'N) and ((s1,v1), . . . , (sn,vn)). For I=1, . . . , N.

Pr((s_i, v_i)=(1,0)|v'_i=0)=1−α, Pr((s_i, v_i)=(0,0)|v'_i=0)=α(1−ϵ),
 Pr((s_i, v_i)=(0,1)|v'_i=0)=αϵ, Pr((s_i, v_i)=(1,1)|v'_i=0)=0, $Pr((s_i, v_i)=(1,0)|v'_i=1)=0$, $Pr((s_i, v_i)=(0,0)|v'_i=1)=\alpha\epsilon$, $Pr((s_i, v_i)=(0,1)|v_i=1)=\alpha(1-\epsilon)$, $Pr((s_i, v_i)=(1,1)|v'_i=1)=1-\alpha$.

In some embodiments, the method may choose the new cell levels (s'1, . . . , s'N) as the vector that maximizes or otherwise increases the value $Pr\{(s'1, \ldots, s'N)|(s1, \ldots, sN)\}$.

In some embodiments, the method may choose the new cell levels (s'1, . . . , s'N) as the vector that maximizes or otherwise increases the value $Pr\{(s1, \ldots, sN)|(s'1, \ldots, s'N)\}$.

In some embodiments, the method may compute the value of bits u1, u2, . . . , uN sequentially, and subsequently computes the value of levels (s'1, . . . , s'N) as (s'1, . . . , s'N)=(v'1, . . . , v'N) $\oplus$ (g1, . . . , gN)=(u2, . . . , uN)·$A^{-1}_{N \times N} \oplus \oplus$(g1, . . . , gN). For i=1, . . . , N the method may compute the following:

1: If $i \in F_{WOM}-F_C$ and i is the j-th element in $F_{WOM}-F_C$ (for $j \in \{1, 2, \ldots, M\}$), let $u_i=b_j$ (the j-th bit in the new data). Otherwise, go to step 2.

2: If $i \in F_C$, let $u_i$ be the constant value specified previously (such as the value 0. Otherwise, go to step 3.

3: If $i \in \{1, 2, \ldots, N\}-F_{WOM}$, let $\mu_i$ take the value that maximizes the value of $Pr\{\mu_i|(s_1, v_1), \ldots, (s_N, v_N), \mu_1, \ldots, \mu_{i-1}\}$ assuming that each of $\mu_{i+1}, \ldots, \mu_N$ is equally likely to be 0 and 1.

In some embodiments, the matrix $A_{N \times N}$, may be specified as follows. Let m be a positive integer, and let $N=2^m$, Let $$G2 = \begin{pmatrix} 1 & 0 \\ 1 & 1 \end{pmatrix}$$

and let $A_{N \times N}=G_2^{\oplus m}$ be the m-th Krobecker product of $G_2$.

In some embodiments, the dither may be a pseudo-random number, which can be generated by a pseudo-random-number generator using a seed number as input. The seed number may be stored in the system.

In some embodiments, the method may compute the value of bits u1, u2, . . . , uN sequentially, and subsequently computes the value of cell levels (s'1, . . . , s'N) as (s'1, . . . s'N) 1, . . . , v'N)$\oplus$(g1, . . . , gN)=(u2, . . . , uN)·$A^{-1}_{N \times N} \oplus \oplus$(g1, . . . , gN). For i=1, . . . , N, the method may compute the following:

Step 1: Let y=($y_1, y_2 \ldots, y_N$)=(($s_1, v_1$), ($s_2, v_2$), . . . , ($s_N, v_N$)) be a vector of N elements, where every element $y_i=(s_i, v_i)$ is a pair of bits.

Step 2: Let J=($j_1, j_2$), . . . $j_M$)=$F_{WOM}-F_C$ where $j_1<j_2<\ldots<j_m$. Let $u_{F_{WOM}-F_C}=(u_{j1}, u_{j2}, \ldots, u_{jM})$. For I=1, . . . , M, let $u_{ji}=b_i$.

Step 3: For every $i \in F_C$, let $u_i=0$.

Step 4: Compute the values of $W_N^i$(y, ($u_1, u_2, \ldots, u_{i-1})|u_{i-1}|u_i=0$) and $W_N^i$(y, ($u_{j1}, u_{j2}, \ldots, u_{i-1}|u_i=1$) for i=1, 2, . . . , N as follows:

Depending on the parity of i, the value of $W_N^i$ is recursively evaluated through one of the formulae below (beginning with n=N/2):

$$W_{2n}^{2i-1}\left((y_1, y_2, \ldots, y_{2n}), (u_1, u_2, \ldots, u_{2i-2})|u_{2i-1}\right) \sum_{u_{2i} \in \{0,1\}} \frac{1}{2} W_n^i((y_1, y_2, \ldots, y_n), (u_1, u_3, u_5, \ldots, u_{2i-3}) \ominus (u_2, u_4, u_6, \ldots, u_{2i-2})|u_{2i-1} \ominus u_{2i})\right) \quad (1)$$

$$W_n^i((y_{n+1}, y_{n+2}, \ldots, y_{2n}), (u_2, u_4, u_6, \ldots, u_{2i-2})|u_{2i}),$$

$$W_{2n}^{2i}((y_1, y_2, \ldots, y_{2n}), (u_1, u_2, \ldots, u_{2i-1})|u_{2i}) = \frac{1}{2} W_n^i((y_1, y_2, \ldots, y_n), \quad (2)$$

$(u_1, u_3, u_5, \ldots, u_{2i-3}) \oplus (u_2, u_4, u_6, \ldots, u_{2i-2})|u_{2i-1} \oplus u_{2i})$ $W_n^i((y_{n+1}, y_{n+2}, \ldots, y_{2n}), (u_2, u_4, u_6, \ldots, u_{2i-2})|u_{2i})$ with the base cases $W_1^1((1,0),(*)|0)=1-\alpha$ $W_1^1((0,0),(*)|0)=\alpha(1-\epsilon)$ $W_1^1((0,1),(*)|0)=\alpha\epsilon$ $W_1^1((1,1),(*)|0)=0$ $W_1^1((1,0),(*)|1)=0$ $W_1^1((0,0),(*)|1)=\alpha\epsilon$ $W_1^1((0,1),(*)|1)=\alpha(1-\epsilon)$ $W_1^1((1,1),(*)|1)=1-\alpha$. (3)

where (*) denotes an empty vector. The operator $\oplus$ between two binary vectors denotes the element-wise exclusive-OR computation. The operator $\ominus$ between two bits denotes the binary exclusive-OR computation.

Step 5: For i=1, 2, . . . , N, if $i \notin F_{WOM}$, then do the following:

Step 5.1: Let $L_N^i$ (y, ($u_1, u_2, \ldots, u_{i-1}$)) take the value $W_N^i$ (y, ($u_1, u_2, \ldots, u_{i-1})|u_i=0$)/$W_N^i$(y, ($u_1, u_2, \ldots, u_{i-1})|u_i=1$).

Step 5.2: Let $u_i$ take the value 0 with probability $$\frac{L_N^i(y, (u_1, u_2, \ldots, u_{i-1}))}{1 + L_N^i(y, (u_1, u_2, \ldots, u_{i-1}))}$$

and take the value 1 probability $$\frac{1}{1 + L_N^i(y, (u_1, u_1, \ldots, u_{i-1}))}.$$

Step 6: Let ($v'_1, v'_2, \ldots, v'_N$)=($u_1, u_2, \ldots, u_N$) $A_{N \times N}$;

Step 7: Let ($s'_1, s'_2, \ldots, s'_N$)=($v'_1 \oplus g_1, v'_2 \oplus g_2, \ldots, v'_N \oplus g_N$).

Step 8: Check if $s'_i \geq s_i$ for i=1, . . . , N. If yes, store the seed number used to generate the dither ($g_1, \ldots, g_N$) in the system, and let ($s'_1, \ldots, s'_N$) be the new cell levels; otherwise, use a new seed number to generate a new value for the dither ($g_1, \ldots, g_N$), and return to Step 1 to repeat the computation.

In some embodiments, the matrix $A_{N \times N}$ may be the generating matrix of a polar code, and FWOM may be contained in the frozen set of the polar code corresponding to the channel described by the transition $2^{nd}$ probabilistic model, where the channel has v'i as the channel input and (si, vi) as the channel output.

In some embodiments, FWOM may be determined as follows:

For i=1, 2, , N, let z denote ((y1, y2, , yN), (u1, u2, , ui−1)), and compute a value $$FER(W_N^i) = \sum_{z:W_N^i(z|0)<W_N^i(z|1)} W_N^i(z|0) + \sum_{z:W_N^i(z|0)=W_N^i(z|1)} \frac{1}{2} W_N^i(z|0).$$

Where $W_N^i(z|0)$ and $W_N^i(z|1)$ computed as discussed below. In addition, let $\Delta R$ be a real number parameter greater than zero. Furthermore, let $F_{WOM}=\{j_1, j_2, \ldots, j_{N(\alpha H(\epsilon)-\Delta R)}\}$ be a subset of $\{1, 2, \ldots, N\}$ with cardinality $N((\alpha H(\epsilon)-\Delta R)$, such that all values in $\{FER(W_N^i)|i\epsilon F_{WOM}\}$ are greater than or equal to each value in $\{FER(W_N^i)|i\epsilon\{1,\ldots,N\}-F_{WOM}\}$.

In some embodiments, the matrix $A_{N\times N}$ may be the generating matrix of a polar code.

After the rewrite described above, which changes cell levels to (s'1, s'2, ..., s'N) to store the data (b1, b2, ..., bM), noise may appear in the cells and change the cell levels to (c1, c2, ..., CM), where ci is a bit that is not necessarily equal to s'i. The error-correction method takes the noisy cell levels (c1, c2, ..., CM) as input, and outputs the stored data (b1, b2, ..., bM).

Figure 3:
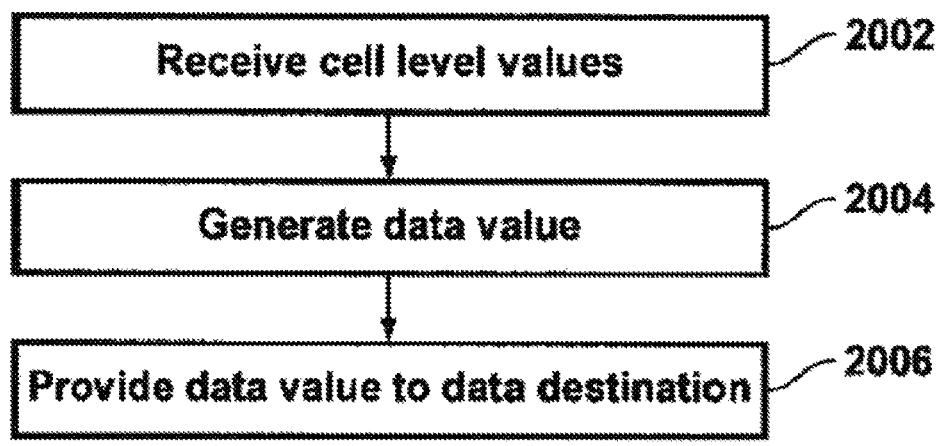
FIG. 3 is a flow diagram that shows example operations performed by a device for decoding a cell charge level value in a WOM read process.

FIG. 3 is a flow diagram that shows example operations of a method performed by a device for decoding cell level values received from the WOM to generate a data value as part of a read operation, in accordance with some embodiments. The device may comprise an external data storage device such as a flash memory device that receives data from a host device, such as a computer, and stores the data in accordance with an error correction encoding and decoding scheme schemes discussed below. For example, the device may comprise a decoder for the purpose of processing cell level values and producing corresponding data values.

The method of FIG. 3 may include one or more operations, functions, or actions as illustrated by one or more of blocks 2002, 2004, and/or 2006. Although the blocks are illustrated in a sequential order, these blocks may also be performed in parallel, and/or in a different order than those described herein. Also, the various blocks may be combined into fewer blocks, divided into additional blocks, and/or eliminated based upon the particular implementation. Additional blocks may be provided that represent other operations, functions, or actions.

The method shown in FIG. 3 may begin in block 2002 "receive cell level values." Block 2002 may be followed by block 2004 "generate data value," and block 2004 may be followed by block 2006 "provide data value to data destination."

In the first operation, represented by the flow diagram block 2002, a set of cell level values to be decoded is retrieved from the WOM.

In the next decoding operation, indicated by block 2004, the set of values is decoded to generate the corresponding data value. Examples of techniques for decoding are discussed in further detail below. At block 2006, the data value is provided to a data destination, such as a host computer. For example, the data value may be transmitted by a transmitter to the data destination.

In particular, to generate the data value, the decoding or error correction function may use a binary vector (u'1, ..., 1'N) and has the following properties:

Property 1: For any $i\epsilon F_C$, $u'_i$ is given the fixed bit value that has been assigned to $u_i$ (which is know in the system).

Property 2: Among all the values that satisfy Property 1, the value assigned to (u'$_1$, ..., u'$_N$) maximizes the probability that "the noise changed the codeword from (s'$_1$, ..., s'$_N$)=(u'$_1$, ..., u'$_N$)$A_{N\times N} \oplus (g_1, \ldots, g_N)$ to ($c_1, \ldots, c_N$)."

The probability may be determined by the errors' probabilistic characteristic. Accordingly, for every i∈FWOM−FC a data bit bj is recovered as u'i, where bj was assigned to ui for the most recent rewrite.

In some embodiments, to generate the data value, the method may use a binary matrix $A_{N\times N}=(a_{i,j})_{N\times N}$ of N rows and N columns, whose value is fixed and known to the system. For example, for i=1, ..., N and j=1, , N $a_{i,j}\epsilon\{0,1\}$ is the bit in the i-th row and j-th column of the matrix $A_{N\times N}$. Furthermore, the method may use a subset of {1, 2, ..., N} denoted by FWOM, and another subset of {1, 2, , N} denoted by FC, such that:

FC contains at least one element. That is, |FC| is greater than or equal to 1,

There are M elements in FWOM but not in FC, that is, |FWOM−FC|=M,

At least one element of {1, 2, ..., N} is neither in FWOM nor in FC. That is, |{1, 2, ..., N}−FWOM−FC| is greater than or equal to 1.

FC is a subset of FWOM. That is, FC∈FWOM.

Furthermore, in some embodiments, the errors in the cells may have the following distribution:

Let $p_0$ and $p_1$ be two real-number parameters between 0 and 1. For i=1, ..., N, we have $Pr\{c_i=0|s'_i=0\} \triangleq Pr\{0|0\}=1-p_0$, $Pr\{c_i=1|s'_i=0\} \triangleq Pr\{1|0\}=p_0$, $Pr\{c_i=0|s'_i=1\} \triangleq Pr\{0|1\}=p_1$ and $Pr\{c_i=1|s'_i=1\} \triangleq Pr\{1|1\}=1-p_1$.

In such embodiments, binary vector ((u'1, ..., 1'N) may have the following properties:

Property 1: For any $i\epsilon F_C$, $u'_i$ is given the fixed bit value that has been assigned to $u_i$ (which is know to the system).

Property 2: Among all the values that satisfy Property 1, the value assigned to (u'$_1$, ... u'$_N$) maximizes the value of $\Pi_{i=1}^N Pr\{c_i|\alpha_i\}$, where $\alpha_i$ denotes the ith bit in the vector (u'$_1$, ... u'$_N$) $A_{N\times N} \oplus (g_1, \ldots g_N)$.

In some embodiments, the matrix $A_{N\times N}$ may be the generating matrix of a polar code, and p is a real number parameter between zero and one. The method may correct errors and may recover the data values (b1, b2, ..., bM) as follows:

1: Recovering the value of (v'$_1$, ..., v'$_N$) using a decoding algorithm of an error-correcting polar code based on the following setting:

The polar code's generating matrix is $A_{N\times N}$.

The polar code encodes the user data ($u_1, \ldots, u_N$) into the codeword (v'$_1$, ..., v'$_N$) via the formula (v'$_1$, ..., v'$_N$)=($u_1, \ldots, u_N$)$A_{N\times N}$.

For i=1, ..., N, the codeword bit v'$_1$ is transmitted through a binary-symmetric channel with transition probability p; and the output of that binary-symmetric channel is the noisy codeword bit $c_i$.

The frozen set of the polar code corresponding to the binary-symmetric channel is contained in $F_C$; and when encoding user data into the codeword, the user-data bits in $F_C$ are fixed at known values (such as all 0's).

The decoding algorithm considers ($c_1, \ldots, c_N$) as the noisy codeword, and recovers the correct value of the original codeword (v'$_1$, ..., v'$_N$).

2: Let (u'$_1$, ..., u'$_N$)=(v'$_1$, ..., v'$_N$)$A_{N\times N}^{-1}$. For every i∈$F_{WOM}$-$F_C$—say $b_j$ was assigned to $u_i$ for the most recent rewrite—we recover the data bit $b_j$ as u'$_i$.

In some embodiments, to generate the data value, the decoding algorithm also may include computing the value of ui for i=1, ..., N as follows:

If i∈$F_C$, let $u_i$ be the constant value that was assigned to it by the previous rewrite.

If $i \notin F_C$, let $u_i$ take the value that maximizes the value of $Pr\{u_i | c_1, \ldots, c_N, u_1, \ldots, u_{i-1}\}$ assuming that each of $u_{i+1}, \ldots, u_N$ is equally likely to be 0 and 1.

In some embodiments, the decoding algorithm may be a list-decoding algorithm that is further specified as follows: Let L be a positive integer parameter that indicates the size of a list, where each element in the list is an assignment of value to (u1, u2, . . . , ui−1) before the value of ui is computed. For i=1, . . . , N, the decoding algorithm computes the value of ui with the following:

If $i \in F_C$, let $u_i$ be constant value that was assigned to it by the previous rewrite.

If $i \notin F_C$, for each element in the list (which is an assignment of value to $(u_1, u_2, \ldots, u_{i-1})$), append to it the value assignment $u_i=0$, and also append to it the value assignment $u_i=0$, and also append to it the value assignment $u_i=1$, thus converting that element into two new elements in the list. If the list now contains more than L elements, keep only the L elements that are most likely in the list. The likelihood of an element in the list may be computed as $Pr\{c_1, \ldots c_N | u_1, \ldots, u_i\}$ assuming that each of $u_{i+1}, \ldots, u_N$ is equally likely to be 0 and 1.

The most likely element in the list may then be chosen as the recovered value for (u1, . . . , uN).

In some embodiments, the stored data (b1, . . . , bM) may itself be an error-correcting code C and therefore may contain redundancy. The decoding algorithm, in 1 may be further specified as follows:

Let L be a positive integer parameter that indicates the size of a list, where each element in the list is an assignment of value to (u1, u2, . . . , ui−1) before the value of ui is computed. For i=1, . . . , N, the decoding algorithm computes the value of ui with the following:

If $i \in F_C$, let $u_i$ be the constant value that was assigned to it by the previous write.

If $i \notin F_C$, for each element in the list (which is an assignment of value to $(u_1, u_2, \ldots, u_{i-1})$), append to it the value assignment $u_i=0$, and also append to it the value assignment $u_i=1$, thus converting that element into two new elements in the list. If the list now contains more than L elements, keep only the L elements that are most likely in the list. The likelihood of an element in the list may be computed as $Pr\{c_1, \ldots, c_N | u_1, \ldots, u_i\}$ assuming that each of $u_{i+1}, \ldots, u_N$ is equally likely to be 0 and 1.

Then, for each element in the list, the method checks if its value assignment to $(u_i | i \in F_{WOM} - F_C)$, which should equal (b1, . . . , bM), is a valid codeword in the error-correcting code C; and if not, remove it from the list. Then, the method may choose the most likely element in the remaining list as the recovered value for (u1, . . . , uN).

In some embodiments, the decoding algorithm may be based on a belief-propagation decoding algorithm for polar error-correcting codes.

In some embodiments, the matrix $A_{N \times N}$ may be specified as follows. Let m be a positive integer, and let $N=2^m$. Let $$G2 = \begin{pmatrix} 1 & 0 \\ 1 & 1 \end{pmatrix},$$

and let $A_{N \times N} = G_2^{\oplus m}$ be the m-th Kronecker product of $G_2$.

In some embodiments, recovering the value action discussed above may further include the following:

1: Let $y=(y_1, y_2, \ldots, y_N)=((c_1 \oplus g_1), (c_2 \oplus g_2) \ldots, (c_N \oplus g_N))$ be a vector of N elements, where every element $y_i = c_i \oplus g_i$ is a bit.

2: For every $i \in F_C$, let $u_i = 0$.

3: Compute the values of $W_N^i(y, (u_1, u_2, \ldots, u_{i-1}) | u_i = 0)$ and $W_N^i(y, (u_1, u_2, \ldots, u_{i-1}) | u_i = 1)$ for i=1, 2, . . . , N as follows:

Depending on the parity of i, the value of $W_N^i$ is recursively evaluated through one of the formulae below (beginning with n=N/2):

$$\sum_{u_{2i} \in (0,1)} \frac{1}{2} W_n^i = \tag{5}$$

$$((y_1, y_2, \ldots, y_n), (u_1, u_3, u_5, \ldots, u_{2i-3}) \ominus (u_2, u_4, u_6, \ldots, u_{2i-2}) |$$
$$u_{2i-1} \ominus u_{2i})$$

$$W_n^i \Big( (y_{n+1}, y_{n+2}, \ldots, y_{2n}), (u_2, u_4, u_6, \ldots, u_{2i-2}) | u_{2i} \Big), \tag{6}$$

$$W \frac{2i}{2n}((y_1, y_2, \ldots, y_{2n}), (u_1, u_2, \ldots, u_{2i-1}) | u_{2i}) =$$

$$\frac{1}{2} W_n^i((y_1, y_2, \ldots, y_{2n}),$$
$$(u_1, u_3, u_5, \ldots, u_{2i-3}) \oplus (u_2, u_4, u_6, \ldots, u_{2i-2}) | u_{2i-1} \oplus u_{2i})$$
$$W_n^i((y_{n+1}, y_{n+2}, \ldots, y_{2n}), (u_2, u_4, u_6, \ldots, u_{2i-2}) | u_{2i})$$

with the base cases $W_1^1((0),(.)|0)=1-p$ $W_1^1((1),(.)|0)=p$ $W_1^1((0),(.)|1)=p$ $W_1^1((1),(.)|1)=1-p$ \quad (7)

where (.) denotes an empty vector. The operator $\oplus$ between two binary vectors denotes the element-wise exclusive-OR computation. The operator $\oplus$ between two bits denotes the binary exclusive-OR computation.

4: For each $i \in F_{WOM} - F_C$, if $W_N^i(y_1, y_2, \ldots, y_N), (u_1, u_2, \ldots, u_{i-1}) | u_i = 0) \geq W_N^i(y_1, y_2, \ldots, y_N), (u_1, u_2, \ldots, u_{i-1}) | u_i = 1)$, let $u_i = 0$; otherwise, let $u_i = 1$ 5: Let $\{u_i | i \in F_{WOM} - F_C\}$ be the recovered value for the data $(b_1, \ldots, b_M)$, where the mapping from the bits in $\{u_i | i \in F_{WOM} - F_C\}$ to the bits in $(b_1, \ldots, b_M)$ is as specified in the previous rewrite operation.

In some embodiments, the method may be a list-decoding algorithm further specified as follows:

Let L be a positive integer parameter that indicates the size of a list, where each element in the list is an assignment of value to (u1, u2, . . . ,ui−1) before the value of ui is computed. In addition, the method may include the following:

1: Let $y=(y_1, y_2, \ldots, y_n)=((c_1 \oplus g_1), (c_2 \oplus g_2), \ldots, (c_N \oplus g_N))$ be a vector on N elements, where every element $y_i = c_i \oplus g_i$ is a bit.

2: For every $i \in F_C$, let $u_i = 0$.

3: Compute the values of $W_N^i(y, (u_1, u_2, \ldots, u_{i-1}) | u_i = 0)$ and $W_N^i(y, (u_1, u_2, \ldots, u_{i-1}) | u_i = 1)$ for i=1, 2, . . . , N as follows:

Depending on the parity of i, the value of $W_N^i$ is recursively evaluated through one of the formulae below (beginning with n=N/2):

$$\sum_{u_{2i} \in (0,1)} \frac{1}{2} W_n^i = \tag{8}$$

$$((y_1, y_2, \ldots, y_n), (u_1, u_3, u_5, \ldots, u_{2i-3}) \ominus (u_2, u_4, u_6, \ldots, u_{2i-2}) |$$
$$u_{2i-1} \ominus u_{2i})$$

-continued $$W_n^i((y_{n+1}, y_{n+2}, \ldots, y_{2n}), (u_2, u_4, u_6, \ldots, u_{2i-2})|u_{2i}), \quad (9)$$

$$W_{2n}^{2i}((y_1, y_2, \ldots, y_{2n}), (u_1, u_2, \ldots, u_{2i-n})|u_{2i}) =$$

$$\frac{1}{2} W_n^i((y_1, y_2, \ldots, y_{2n}),$$

$$(u_1, u_3, u_5, \ldots, u_{2i-3}) \oplus (u_2, u_4, u_6, \ldots, u_{2i-2})|u_{2i-1} \oplus u_{2i}) W_n^i =$$

$$((y_{n+1}, y_{n+2}, \ldots, y_{2n}), (u_2, u_4, u_6, \ldots, u_{2i-2})|u_{2i})$$

with the base cases $$W_1^1((0),(.)|0) = 1-p$$

$$W_1^1((1),(.)|0) = p$$

$$W_1^1((0),(.)|1) = p$$

$$W_1^1((1),(.)|1) = 1-p \quad (10)$$

where (.) denotes an empty vector. The operator $\oplus$ between two binary vectors denotes the element-wise exclusive-OR computation. The operator $\oplus$ between two bits denotes the binary exclusive-OR computation.

4: For i=1, 2, ..., N, do:
If i∈$F_C$, for each element in the list (which is an assignment of value to $(u_1, u_2, \ldots, u_{i-1})$, append it to the value assignment $u_i=0$, and also append it to the value assignment $u_i=1$, thus converting that element into two new elements in the list. If the list now contains more than L elements, keep only the L elements that are most likely in the list. The likelihood of an element in the list may be computed as $W_N^i((y_1, \ldots, y_N), (u_1, \ldots, u_{i-1})|u_i)$.

5: Choose the most likely element in the list as the recovered value for $(u_1, \ldots u_N)$. The likelihood of an element in the list here may be computed as $W_N^N((y_1, \ldots, y_N), (u_1, \ldots, u_{N-1})|u_N)$. Then let $\{u_1|i\in F_{WOM}-F_C\}$ be the recovered value for the data $(b_1, \ldots, b_M)$ where the mapping from the bits in $\{u_1|i\in F_{WOM}-F_C\}$ to the bits in $(b_1, \ldots, b_M)$ is as specified in the previous rewrite operation.

In some embodiments, the stored data (b1, ..., bM) may itself be an error-correcting code C and therefore may contain redundancy and the method may include:
Let L be a positive integer parameter that indicates the size of a list, where each, element in the list is an assignment of value to (u1, u2, ..., ui−1) before the value of ui is computed. The method further includes the following:

1: Let $y=(y_1, y_2, \ldots, y_n) = ((c_1 \oplus g_1), (c_2 \oplus g_2), \ldots, (c_N \oplus g_N))$ be a vector of N elements, where every element $y_i = c_i \oplus g_i$ is a bit.

2: For every i∈$F_C$, let $u_i=0$.

3: Compute the values of $W_N^i(y, (u_1, u_2, \ldots, u_{i-1})|u_i=0)$ and $W_N^i(y, (u_1, u_2, \ldots, u_{i-1})|u_i=1)$ for i=1, 2, ..., N as follows:

Depending on the parity of i, the value of $W_N^i$ is recursively evaluated through one of the formulae below (beginning with n=N/2):

$$\sum_{u_{2i} \in (0,1)} \frac{1}{2} W_n^i = ((y_1, y_2, \ldots, y_n), \quad (11)$$

$$(u_1, u_3, u_5, \ldots, u_{2i-3}) \ominus (u_2, u_4, u_6, \ldots, u_{2i-2})|u_{2i-1} \ominus u_{2i})$$

$$W_n^i((y_{n+1}, y_{n+2}, \ldots, y_{2n}), (u_2, u_4, u_6, \ldots, u_{2i-2})|u_{2i}), \quad (12)$$

$$W_{2n}^{2i}((y_1, y_2, \ldots, y_{2n}), (u_1, u_2, \ldots, u_{2i-n})|u_{2i}) =$$

$$\frac{1}{2} W_n^i((y_1, y_2, \ldots, y_{2n}),$$

$$(u_1, u_3, u_5, \ldots, u_{2i-3}) \oplus (u_2, u_4, u_6, \ldots, u_{2i-2})|u_{2i-1} \oplus u_{2i})$$

$$W_n^i((y_{n+1}, y_{n+2}, \ldots, y_{2n}), (u_2, u_4, u_6, \ldots, u_{2i-2})|u_{2i})$$

with the base cases $$W_1^1((0),(.)|0) = 1-p$$

$$W_1^1((1),(.)|0) = p$$

$$W_1^1((0),(.)|1) = p$$

$$W_1^1((1),(.)|1) = 1-p \quad (13)$$

where (.) denotes an empty vector. The operator $\oplus$ between two binary vectors denotes the element-wise exclusive-OR computation. The operator $\oplus$ between two bits denotes the binary exclusive-OR computation.

4: For i=1, 2, ..., N, do:
If i∈$F_C$, let $u_i=0$.
If i∉$F_C$, for each element in the list (which is an assignment of value to $(u_1, u_2, \ldots, u_{i-1})$, append it to the value assignment $u_i=0$, and also append it to the value assignment $u_i=1$, thus converting that element into two new elements in the list. If the list now contains more than L elements, keep only the L elements that are most likely in the list. The likelihood of an element in the list may be computed as $W_N^i((y_1, \ldots, y_N), (u_1, \ldots, u_{i-1})|u_i)$.

5: Then, for each element in the list, check if its value assignment to $(u_i|i\in F_{WOM}-F_C)$, which should equal $(b_1, \ldots, b_M)$, is a valid codeword in the error-correcting code C; and if not, remove it from the list. Then, choose the most likely element in the remaining list as the recovered value for $(u_1, \ldots u_N)$. The likelihood of an element in the list here may be computed as $W_N^N((y_1 \ldots, u_N), (u_1, \ldots, u_{N-1})$. Then let $\{u_i|i\in F_{WOM}-F_C\}$ be the recovered value for the data $(b_i, \ldots, b_M)$, where the mapping from the bit in $\{u_i|i\in F_{WOM}-F_C\}$ to the bits in $(b_1, \ldots, b_M)$ is as specified in the previously rewrite operation.

In some embodiments, FC may be determined as follows: Let the target block error rate be B, a non-negative real-number parameter between 0 and 1. Let (j1, j2, ..., jN) be a permutation of {1, 2, ..., N} such that the decoding error probability of the bit uj1 is the greatest, the decoding error probability of the bit uj2 is the second greatest, and so on, and the decoding error probability of the bit ujN is the smallest. Let the size of FC, |FC|, be chosen as the smallest integer such that the summation of the decoding error probabilities of the bits $u_{j|FC|+1}, u_{j|FC|+2}, \ldots, u_{j_N}$ is no greater than B. Let FC={j1, j2, ..., j|FC|}.

In some embodiments, FC⊆FWOM. In alternative embodiments, FC is not a subset of FWOM. That is, FC−FWOM is not empty.

In some embodiments, the rewriting or encoding methods described above are modified to include storing the value of the bits $\{u_i|i\in F_C-F_{WOM}\}$ in $N_{additional}$ additional cells, using an error-correcting code of length $N_{additional}$ that encodes |FC−FWOM| bits. (Those additional cells are disjoint for the rewrites.)

In some embodiments, the error correction of decoding methods described above are modified to include recovering the value of the bits in $\{u_i|i\in F_C-F_{WOM}\}$ by decoding the error-correcting code stored in the $N_{additional}$ additional cells. In addition, the error correction or decoding method described above may be such that the value of the bits in $\{u_i|i\in F_C-F_{WOM}\}$ is fixed as the above recovered value.

In some embodiments, for j=1, 2, ..., t, FCj denotes the set FC for the j-th rewrite. FWOMj denotes the set FWOM for the j-th rewrite, and $N_{additional}$ additional cells are used for a code that supports t rewrites and error-correction processes. In such, embodiments, for j=1, . . . , t, M=|FCj−FWOMj| bits are stored in the j-th rewrite. The code can be any code described herein.

In some embodiments, methods of encoding discussed above may be modified such that for j=1, 2, . . . , t, and for the j-th rewrite, the value of the bits $\{u_i | i \in F_{C,j}-F_{WOM,j}\}$ in the $N_{additional}$ additional cells, are stored using the code specified above for the $N_{additional}$ additional cells.

In some embodiments, for j=1, . . . , t, M=|FC,j−FWOMj| bits are stored in the j-th rewrite, and methods of decoding discussed above may be modified such that the value of the bits in $\{u_i | i \in F_{C,j}-F_{WOM,j}\}$ are recovered by decoding the rewrite- and error-correction code stored in the $N_{additional}$ additional cells. In addition, methods of decoding discussed above may be modified such that the value of the bits in $\{u_i | i \in F_{C,j}-F_{WOM,j}\}$ is fixed as the above value.

In some embodiments, the WOM cells are binary. In alternative or additional embodiments, every cell has q-levels: level 0, level 1, . . . , and level q-1, and the exclusive-OR operation is generalized to the modular-q summation.

In such embodiments, methods for rewriting and error-correction or encoding may use the cells in the following level-by-level approach:

The methods may first use level 0 and level 1 and apply the previously described features for binary cells;

The methods may then use level 1 and level 2 (as if they were level 0 and level 1) and apply the previously described features for binary cells;

The methods may then use level 2 and level 3 (as if they were level 0 and level 1) and apply the previously described features for binary cells;

The above process(es) may continue, until finally, the methods may use level q-2 and level q-1 (as if they were level 0 and level 1) and apply the previously described features for binary cells.

In some embodiments, methods for rewriting and error correction or encoding may be modified such that each ui, si, gi, vi, s'i or v'i takes its value from the set $\{0,1, \ldots, q-1\}$, and the exclusive-OR operation may be generalized to the modular-q summation.

An example, as discussed with reference to FIGS. 4 and 5.

Figure 4:
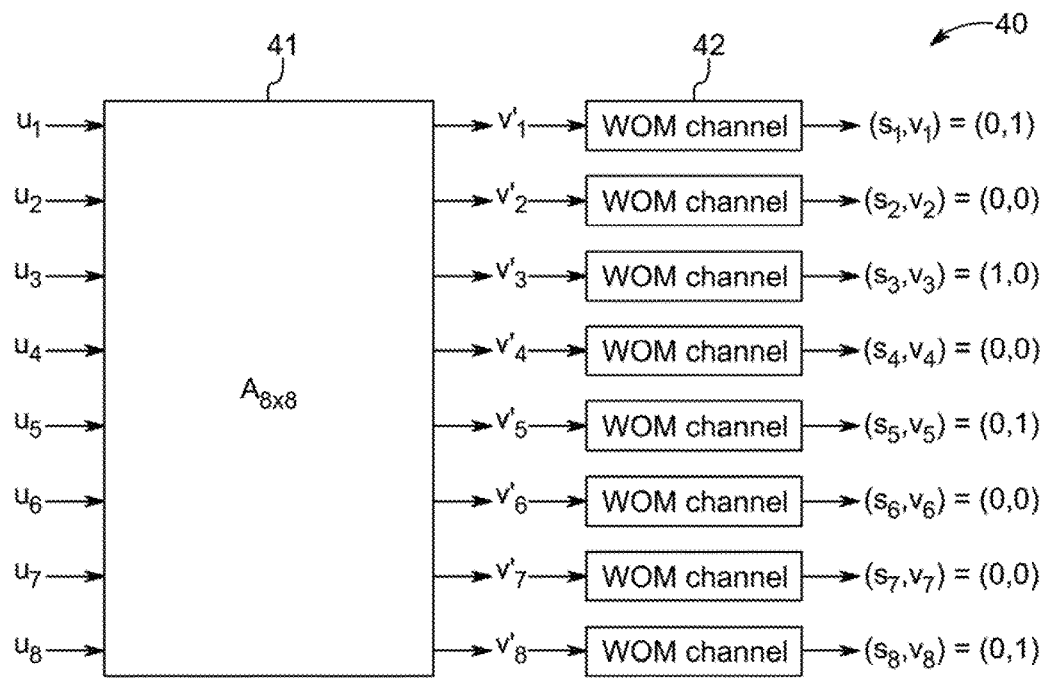
FIG. 4 is a block diagram that shows an example device for encoding a cell charge level value in a WOM rewrite process.
Figure 5:
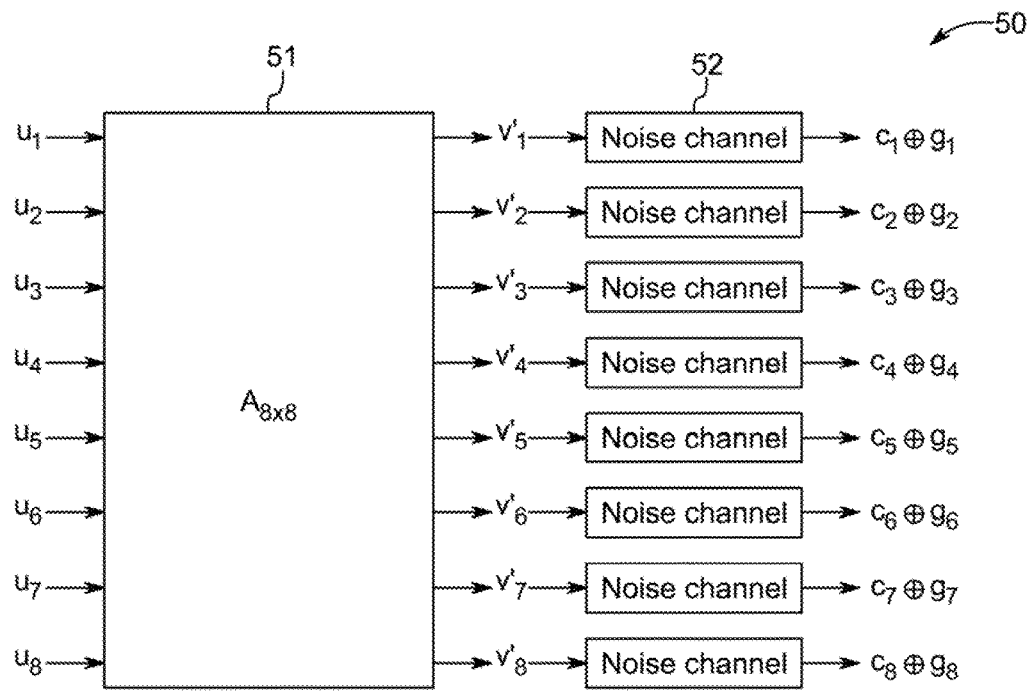
FIG. 5 is a block diagram that shows an example device for decoding a cell charge level value in a WOM read process.

FIG. 4 illustrates an embodiment of an encoder. Let the code have N=8 cells. Let the $A_{N \times N} = A_{8 \times 8}$ matrix 41 be:

$$\begin{pmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{pmatrix}$$

Consider a rewrite (encode) operation and the subsequent error-correction (decode) operation. For the rewrite, let the dither be (g1, . . . , gN)=(g1, . . . , g8)=(1,0,1,0,1,0,0,1). Let a=0:87. Let e=0:29. Let FWOM={1, 2, 4, 5, 6}. Let FC={2, 6}. Let M=|FWOM−FC|=|{1, 4, 5}|=3. And let the data to be stored be (b1, b2, . . . , bM)=(b1, b2, b3)=(1, 0, 1). Assume the cell levels before this rewrite are (s1, . . . , sN)=(s1, . . . , sN)=(0, 0, 1, 0, 0, 0, 0, 0). As a result (v1, . . . , vn)=(v1, . . . , v8)=(s1 ⊕g1, . . . , s8⊕g8)=(1, 0, 0, 0, 1, 0, 0, 1).

Consider the rewrite where (v1, . . . , v8)=(u1, . . . , u8) $A_{8 \times 8}$ and the transition probabilities of the WOM channels 42 are shown in FIG. 4. The method of rewriting calculates that (u1, . . . , u8)=(1, 0, 0, 0, 1, 0, 0, 0) (note that u1=b1=1, u4=b2=0, u5=b3=1, and u2=u6=0); therefore (v'1, . . . , v'8)=(u1, . . . , u8) $A_{8 \times 8}$=(0, 0, 0, 0, 1, 0, 0, 0) and (s'1 . . . , s'8)=(v'1⊕g1, . . . v'8⊕g8)=(1,0, 1, 0, 0, 0, 0, 1). As a result the cells are programmed to level (s'1, . . . s'8)=(1, 0, 1, 0, 0, 0, 0, 1).

To write the data $(b_1, b_2, \ldots, b_M)$, our method has the following inputs: (1) The current cell levels $(s_1, s_2, \ldots, s_N)$, and (2) the new data to store $(1, b_2, \ldots b_M)$. It then computes the output $(s'_1, s'_2, \ldots, s'_N)$, and programs the cells to those new levels. Here are our constraints:

1) As mentioned before, for i=1, 2, . . . , N, we have the constraint that is $s'_i \geq s_i$.
2) The new cell levels $(s'_1, s'_2, \ldots, s'_N)$ represents the new data $(b_1, b_2, \ldots, b_M)$, via the mapping specified by our method.

Next, consider the error correction (decode). FIG. 5 illustrates an embodiment of a decoder. The noise channels 52 are each a binary-symmetric channel with error probability p. Assume that after the above rewrite, noise changes the cell levels from (s'1, . . . , s'8)=(1, 0, 1, 0, 0, 0, 0, 1) to (c1, . . . , c8)=(0, 1, 1, 0, 0, 0, 0, 1). The method of error correction recovers the value of (u1, . . . u8) as (1, 0, 0, 0, 1, 0, 0, 0) using the matrix 51. Therefore the stored data is correctly received as (b1, b2, b3)=(u1, u4, u5)=(1, 0, 1). 65540656V.1

The remainder of the description is organized as follows. Section II includes a basic model and notations. Section III includes an embodiment of code construction. Section IV includes embodiments of code. Section V includes embodiments of code extensions. Section VI includes an analysis of actual sum-rates achieved by a code embodiment. Section VII includes further example embodiments. Section VIII includes concluding remarks.

II. Basic Model

A memory may have N(=$2^m$) WOM cells that are used to store data, where each cell has two levels; 0 and 1. The cells can change only from level 0 to level 1, but not vice versa.

A sequence of t messages $M_1, M_2, \ldots, M_t$ may be written into the WOM cells, and when $M_i$ is written, the value of the previous messages need not be remembered. (Let $M_j$ denote the number of bits in the message $M_j$, and let $M_j \in \{0,1\}^{M_j}$.) For simplicity, let the cells be all at level 0 before the first write happens.

After cells are programmed, noise may appear in the cell levels. Noise may be considered to be a BSC with error probability p, denoted by BSC(p). These errors may be hard errors, namely, they physically change the cell levels from 0 to 1 or from 1 to 0. For flash memories, such errors can be caused by read/write disturbs, interference and charge leakage, for example, and may be quite common.

A. The Model for Rewriting

A code for rewriting and error correction may comprise of t encoding functions $E_1, E_2, \ldots, E_t$ and t decoding functions $D_1, D_2, \ldots, D_t$. For i=1, 2, . . . , N and j=1, 2, . . . , t, let $s_{i,j} \in \{0,1\}$ and $s'_{i,j} \in \{0,1\}$ denote the level of the i-th cell right before and after the j-th write, respectively. As discussed above, $s'_{i,j} \geq s_{i,j}$. Let $c_{i,j} \in \{0,1\}$ denote the level of the i-th cell at any time after the j-th write and before the (j+1)-th write, when reading of the message $M_j$ can happen. The error $c_{i,j} \oplus s'_{i,j} \in \{0,1\}$ is the error in the i-th cell caused by the noise channel BSC(p). (Here ⊕ is an XOR function.) For j=1, 2, . . . , t, the encoding function $$E_j: \{0,1\}^N \times \{0,1\}^{M_j} \to \{0,1\}^S$$

changes the cell levels from $s_j=(s_{1,j}, s_{2,j}, \ldots, s_{N,j})$ to $s'_j=(s'_{1,j}, s'_{2,j}, \ldots, s'_{N,j})$ given the initial cell state $s_j$ and the message to store $M_j$. (Namely, $E_j(s_j, M_j)=s'_j$.) When the reading of $M_j$ happens, the decoding function $$D_j: \{0,1\}^N \to \{0,1\}^{M_j}$$

recovers the message $M_j$ given the noisy cell state $c_j=(c_{1,j}, c_{2,j}, \ldots c_{N,j})$. Namely, $D_j(c_1)=M_j$.)

For j=1, . . . ,t, $$R_j = \frac{M_j}{N}$$

is called the rate of the j-th write. $R_{sum}=\Sigma_{j=1}^t R_j$ is called the sum-rate of the code. When there is no noise, the maximum sum-rate of WOM code is known to be $\log_2(t+1)$, however, for noisy WOM, the maximum sum-rate is still largely unknown.

B. Polar Codes

A short introduction to polar codes follows due to its relevance to the code construction embodiments discussed herein. A polar code is a linear block error correcting code proposed by Arkan, See, e.g. E. Arkan, "Channel polarization: A method for constructing capacity-achieving codes for symmetric binary-input memoryless channels," *IEEE Trans. Inf. Theor.*, vol. 55, no. 7, pp. 3051-3073, July 2009. It is the first known code with an explicit construction that provably achieves the channel capacity of symmetric binary-input discrete memoryless channels (B-DMC). The encoder of a polar code transforms N input bits $u=(u_1, u_2, \ldots, u_N)$ to N codeword bits $x=(x_1, x_2, \ldots, x_N)$ through a linear transformation. (e.g. $x=uG_2^{\oplus m}$ where $$G_2 = \begin{pmatrix} 1 & 0 \\ 1 & 1 \end{pmatrix},$$

and $G_2^{\oplus m}$ is the m-th Kronecker product of $G_2$.) The N codeword bits $(x_1, x_2, \ldots, x_N)$ are transmitted through N independent copies of a B-DMC. For decoding, N transformed binary input channels $\{W_N^{(1)}, W_N^{(2)}, \ldots, W_N^{(N)}\}$ can be synthesized for $u_1, u_2, \ldots, u_N$, respectively. The channels are polarized such that for large N, the fraction of indices i for which $I(W_N^{(i)})$ is nearly 1 approaches the capacity of the B-DMC, while the values of $I(W_N^{(i)})$ for the remaining indices i are nearly 0. The latter set of indices are called the frozen set. For error correction, the $u_i$'s with i in the frozen set take fixed values, and the other $u_i$'s are used as information bits. A successive cancellation (SC) decoding algorithm achieves diminishing block error probability as N increases.

Polar code can also be used for optimal lossy source coding, which has various applications. See, e.g. S. Korada and R. Urbanke, "Polar codes are optimal for lossy source coding," *IEEE Trans. Inf. Theor.*, vol. 56, no. 4, pp. 1751-1768, April 2010. In particular the idea may be used to build capacity achieving WOM codes. See, e.g., D. Burshtein and A. Strugatski, "Polar write once memory codes," in Proc. IEEE international Symposium on Information Theory, July 2012, pp., 1972-1976.

The presented code analysis uses the concept of upgrading and degrading channels, defined based on frozen sets. As taught by Tal and Vardy, a channel W': X→Z is called "degraded with respect to a channel W: X→Y" if an equivalent channel of W' can be constructed by concatenating W with an additional channel Q: Y→Z, where the inputs of Q are linked with the outputs of W. See, e.g. I. Tal and A. Vardy, "How to construct polar codes," CoRR, vol. abs/1105.6164, 2011. That is, $$W'(z|x)=\Sigma_{y\in Y} W(y|x)Q(z|y)$$

It may be denoted as W'≤W. Equivalently, the channel W is called "an upgrade with respect to W'", denoted by W≥W'.

III. Code Construction

In this section, embodiments of code construction are described that combine rewriting with error correction.

A. Basic Code Construction with a Nested Structure

1) General: First, consider a single rewrite (namely, one of the t writes). Let $s=(s_1, s_2, \ldots, s_N) \in \{0,1\}^N$ and $s'=(s'_1, s'_2, \ldots, s'_N) \in \{0,1\}^N$ denote the cell levels right before and after this rewrite, respectively. Let $g=(g_1, g_2, \ldots, g_n)$ be a pseudo-random, bit sequence with independent and identically distributed bits that are uniformly distributed. The value of g is known to both the encoder and the decoder, and g is called a dither.

Figure 6:
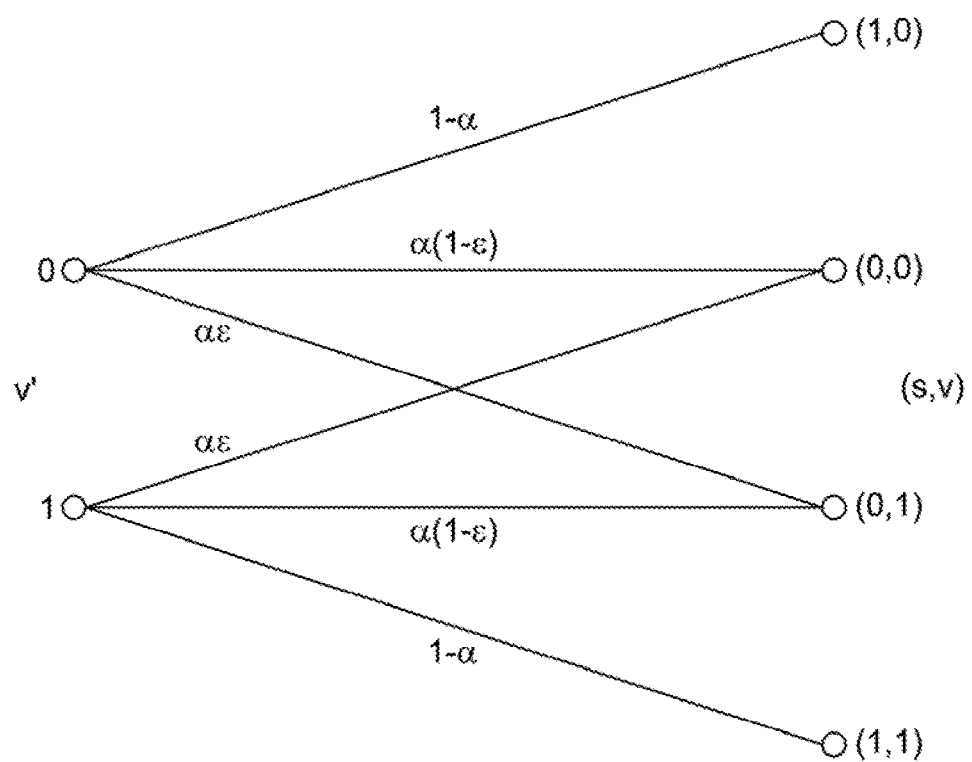
FIG. 6 illustrates an example WOM channel WOM ($\alpha,\varepsilon$).

For i=1, 2, . . . , N, let $v_i=s_i \oplus g_i \in \{0,1\}$ and $v'_i=s'_i \oplus g_i \in \{0,1\}$ be the value of the i-th cell before and after the rewrite, respectively. The WOM channel is built, such as shown in FIG. 6, for this rewrite, denoted by WOM (α,ε).

Here α∈[0,1] and $$\varepsilon \in \left[0, \frac{1}{2}\right]$$

are given parameters, with $$\alpha = 1 - \Sigma_{i=1}^N \frac{s_i}{N}$$

representing the fraction of cells, at level 0 before the rewrite, and $$\varepsilon = \frac{\Sigma_{i=1}^N s'_i s_i}{N - \Sigma_{i=1}^N s_i}$$

representing the fraction of cells that are changed from level 0 to level 1 by the rewrite. Let $F_{WOM(\alpha,\varepsilon)} \subseteq \{1, 2, \ldots, N\}$ be the frozen set of the polar code corresponding to this channel WOM(α,ε). It is known that $$\lim_{N \to \infty} \frac{|F_{WOM(\alpha,\varepsilon)}|}{N} = \alpha H(\varepsilon).$$

See, e.g. I. Tal and A. Vardy, "How to construct polar codes," CoRR, vol. abs/1105.61.64,2011.

For the noise channel BSC(p), let $F_{BSC(p)} \subseteq \{1, 2, \ldots, N\}$ be the frozen set of the polar code corresponding to the channel BSC(p). It is known that $$\lim_{N \to \infty} \frac{|F_{BSC(p)}|}{|N|} = H(p).$$

Figure 7A:
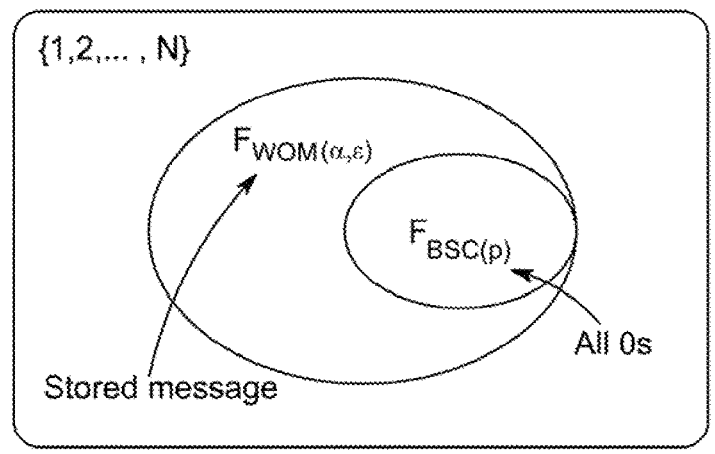
FIG. 7 illustrates examples of: (a) Nested code for $F_{BSC(p)} \subseteq F_{WOM(\alpha,\varepsilon)}$, (b) General code.

In this subsection, $F_{BSC(p)} \subseteq F_{WOM(\alpha,\varepsilon)}$. This case is as illustrated in FIG. 7(a). In this case, the code has a nice nested structure: for any message $M \in \{0,1\}^M$, the set of cell values $V_M \subseteq \{0,1\}^N$ that represent the message M is a linear subspace of a linear error correcting code (ECC) for the noise channel BSC(p), and $\{V_M | M \in \{0,1\}^M\}$ form a partition of the ECC. Later the code may be extended to more general cases.

2) The encoder: Let $E: \{0,1\}^N \times \{0,1\}^M \to \{0,1\}^N$ be the encoder for this rewrite. Namely, given the current cell state s and the message to write $M \in \{0,1\}^M$, the encoder is configured to find a new cell state s'=E(s, M) that represents M and is above s (that is, cell levels only increase).

The encoding function in Algorithm 1 follows. Here y and u are two vectors of length $$N, u_{F_{WOM(\alpha,\varepsilon)} - F_{BSC(p)}} \triangleq \{u_i \mid i \in F_{WOM(\alpha,\varepsilon)} - F_{BSC(p)}\}$$

are all the bits $u_i$ in the frozen set $F_{WOM(\alpha,\varepsilon)}$ but not $$F_{BSC(p)}, u_{F_{BSC(p)}} \triangleq \{u_i \mid i \in F_{BSC(p)}\}$$

are all the bits $u_i$ in $F_{BSC(p)}$, and $G_2^{\otimes m}$ is the m-th Kronecker product of $$G_2 = \begin{pmatrix} 1 & 0 \\ 1 & 1 \end{pmatrix}.$$

---

Algorithm 1 The encoding function s' = E(s, M)

$y \leftarrow ((s_1, v_1), (s_2, v_2), \ldots, (s_N, v_N))$.
Let $u_{F_{WOM(\alpha,\varepsilon)} - F_{BSC(p)}} \leftarrow M$.
Let $u_{F_{BSC(p)}} \leftarrow (0,0,\ldots,0)$.
for i from 1 to N do
  if $i \notin F_{WOM(\alpha,\varepsilon)}$ then $$L_N^{(i)}(y, (u1, u2, \ldots, u_{i-1})) \leftarrow \frac{W_N^{(i)}(y, (u1, u2, \ldots, u_{i-1}) | u_i = 0)}{W_N^{(i)}(y, (u1, u2, \ldots, u_{i-1}) | u_i = 1)}.$$

(Comment: Here $W_N^{(i)}$ (y, (u1, u2, ..., $u_{i-1}$)|$u_i$ = 0) and $W_N^{(i)}$ (y, (u1, u2, ..., $u_{i-1}$)|$u_i$ = 1) can be computed recursively using formulae (22), (23) in E. Arikan, "Channel polarization: A method for constructing capacity-achieving codes for symmetric binary-input memoryless channels," *IEEE Trans. Inf. Theor.*, vol. 55, no. 7, pp. 3051-3073, July 2009,).

$$\text{Let } u_i \leftarrow \begin{cases} 0 & \text{with probability } \frac{L_N^{(i)}}{1 + L_N^{(i)}} \\ 1 & \text{with probability } \frac{1}{1 + L_N^{(i)}} \end{cases}.$$

Let $v' \leftarrow u G_2^{\otimes m}$.
Let $s' \leftarrow v' \oplus g$.

---

3) The decoder: The decoder $D: \{0,1\}^N \to \{0,1\}^M$ M now follows. Let $c=(c_1, c_2, \ldots, c_N) \in \{0,1\}^N$ be the noisy cell levels after the message is written. Given c, the decoder should recover the message as D(c)=M.

The decoder may be configured to operate the same way as a polar error correcting code. The decoding operation of one embodiment is presented as Algorithm 2.

---

Algorithm 2 The decoding function $\hat{M} = D(c)$

View $c \oplus g$ as a noisy codeword, which is the output of a binary
symmetric channel BSC(p).
Decode $c \oplus g$ using the decoding algorithm of the polar error-
correcting code, where the bits in the frozen set $F_{BSC(p)}$ are set
to
0s. Let $\hat{v} = (\hat{v}_1, \hat{v}_2, \ldots, \hat{v}_N)$ be the recovered codeword.
Let $\hat{M} \leftarrow (\hat{v}(G_2^{\otimes m})^{-1})_{F_{WOM(\alpha,\varepsilon)} - F_{BSC(p)}}$, which denotes the elements
of the vector $\hat{v}(G_2^{\otimes m})^{-1}$
whose indices are the set $F_{WOM(\alpha,\varepsilon)} - F_{BSC(p)}$.

---

As is clear from the polar error-correcting code, the encoding and the decoding algorithms may have time complexity O(NlogN).

4) Nested code for t writes: In the above, the operations of the encoder and the decoder for one rewrite have been described. The operations can be applied to a t-write error correcting WOM code as follows. For j=1, 2, . . . , t, for the j-th write, replace $\alpha, \varepsilon, s, s', v, v', M, M, E, D, c, \hat{M}, \hat{v}$, by $\alpha_{j-1}, \varepsilon_j, s_j, s'_j, v_j, v'_j, M_j, M_j, E_j, D_j, c_j, \hat{M}_j, \hat{v}_j$, respectively, and apply the above encoder and decoder.

Note that when $N \to \infty$, the values of $\alpha_1, \alpha_2, \ldots, \alpha_{t-1}$ can be computed using $\varepsilon_1, \varepsilon_2, \ldots, \varepsilon_{t-1}$; for BSC(p), $\alpha_j = \alpha_{j-1}(1-\varepsilon_j)(1-p) + (1-\alpha_{j-1}(1-\varepsilon_j))p$. Improving the code may include choosing other values for $\varepsilon_1, \varepsilon_2, \ldots, \varepsilon_t$ that maximize or otherwise increases the sum-rate.

B. Extended Code Construction

Code for the case $F_{BSC(p)} \subseteq F_{WOM(\alpha,\varepsilon)}$ has so far been discussed. For relatively small p and typical values of $(\alpha_0, \varepsilon_1), (\alpha_1, \varepsilon_2), \ldots, (\alpha_{t-1}, \varepsilon_t)$, the above condition holds. Now consider the general case where $F_{BSC(p)}$ is not necessarily a subset of $F_{WOM(\alpha,\varepsilon)}$.

Figure 7B:
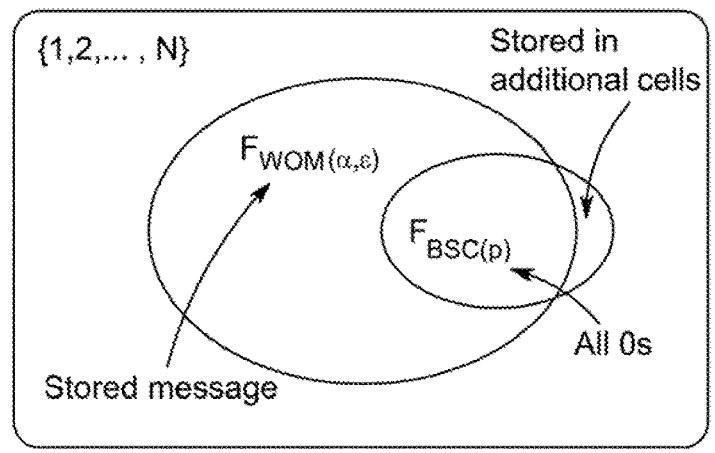

The encoder in Algorithm 1 may be revised as follows. The bits are then stored in $u_{F_{BSC(p)} - F_{WOM(\alpha,\varepsilon)}}$ using $N_{additional,j}$ cells (for the j-th write). (This implementation is illustrated in FIG. 7(b).) In this disclosure, for simplicity, assume the bits in $u_{F_{BSC(p)} - F_{WOM(\alpha,\varepsilon)}}$ are stored using just an error correcting code designed for the noise channel BSC(p). (The bits can be stored using an error-correcting WOM code, such as the one presented above, for higher rates.) Therefore, $$\lim_{N \to \infty} \frac{N_{additional,j}}{|F_{BSC(p)} - F_{WOM(\alpha_{j-1}, \varepsilon_j)}|} = \frac{1}{1 - H(p)}.$$

And the sum-rate becomes $$R_{sum} = \frac{\sum_{j=1}^{t} M_j}{N + \sum_{j=1}^{t} N_{additional,j}}.$$

The decoder in Algorithm 2 may be revised as follows. First recover the bits in $u_{F_{BSC(p)} - F_{WOM(\alpha,\varepsilon)}}$ using the decoding algorithm of the ECC for the $N_{additional,j}$ additional cells. Then carry out Algorithm 2, except that the bits in $F_{BSC(p)}$-$F_{WOM(\alpha,\varepsilon)}$ are known to the decoder as the above recovered values instead of 0s.

IV. Code Analysis

In this section, the correctness of the above code construction is shown, and its performance is analyzed.

A. Correctness of the Code

The correctness of the code is addressed first. The encoder in Algorithm 1 works similarly to the WOM code encoder in D. Burshtein and A. Strugatski, "Polar write once memory codes." In Proc. IEEE International Symposium on Information Theory, July 2012, pp. 1972-1976, with an exception that the bits in $F_{WOM(\alpha,\varepsilon)}$ are not all occupied by the message M, instead, the bits in its subset $F_{WOM(\alpha,\varepsilon)} \cap F_{BSC(p)}$ are set to be constant values: all 0s. Therefore, the encoder successfully rewrites data in the same way as the code in D. Burshtein and A. Strugatski, "Polar write once memory codes," in Proc. IEEE International Symposium on Information Theory, July 2012, pp. 1972-1976. Next, the decoder in Algorithm 2 recovers the cell values from noise in the same way as the standard polar ECC. Then, the stored message M is extracted from it.

One item to note is that although the physical noise may act on the cell levels $s=(s_1, s_8, \ldots, s_N)$, the error correcting code used in the construction is actually for the cell values $v=(v_1, v_2, \ldots, v_n)=(s_1 \oplus g_1, s_2 \oplus g_2, \ldots, s_N \oplus g_N)$. However, the pseudo-random dither g has independent and uniformly distributed elements, and so when the noise channel for s is BSC(p), the corresponding noise channel for v is also BSC(p).

B. The Size of $F_{WOM(\alpha,\varepsilon)} \cap F_{BSC(p)}$

It may be seen that if $F_{BSC(p)} \subseteq F_{WOM(\alpha,\varepsilon)}$, the code has a nested structure. In general, it is observed how large the intersection $F_{WOM(\alpha,\varepsilon)} \cap F_{BSC(p)}$ can be. For convenience of presentation, consider one rewrite as in Section III-A, where the parameters are $\alpha$ and $\varepsilon$ (instead of $\alpha_{j-1}$, $\varepsilon_j$).

Lemma 1. When $H(p) \leq \alpha H(\varepsilon)$, $\lim_{N \to \infty} \frac{|F_{BSC(p)}|}{N} \leq \lim_{N \to \infty} \frac{|F_{WOM(\alpha,\varepsilon)}|}{N}$.

Proof: $\lim_{N \to \infty} \frac{|F_{BSC(p)}|}{N} = H(p) \leq \alpha H(\varepsilon) = \lim_{N \to \infty} \frac{|F_{WOM(\alpha,\varepsilon)}|}{N}$.

Lemma 2. When $p \leq \alpha\varepsilon$, $$F_{WOM(\alpha,\frac{p}{\alpha})} \subseteq (F_{BSC(p)} \cap F_{WOM(\alpha,\varepsilon)}),$$

and $$(F_{WOM(\alpha,\varepsilon)} \cup F_{BSC(p)}) \subseteq F_{BSC(\alpha\varepsilon)}.$$

Proof: (1) In FIG. 8, by setting $$\varepsilon^* = \frac{p}{\alpha},$$

note that $$BSC(p) \leq WOM\left(\alpha, \frac{p}{\alpha}\right).$$

Therefore $$F_{WOM(\alpha,\frac{p}{\alpha})} \subseteq F_{BSC(p)}.$$

Figure 9:
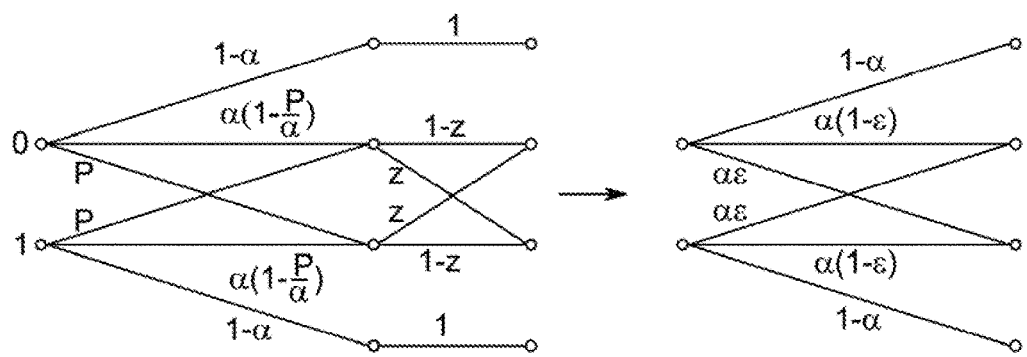

(2) In FIG. 9, it can be seen that $$WOM(\alpha,\varepsilon) \leq WOM\left(\alpha, \frac{p}{\alpha}\right).$$

Therefore, $$F_{WOM(\alpha,\frac{p}{\alpha})} \subseteq F_{WOM(\alpha,\varepsilon)}.$$

Figure 8:
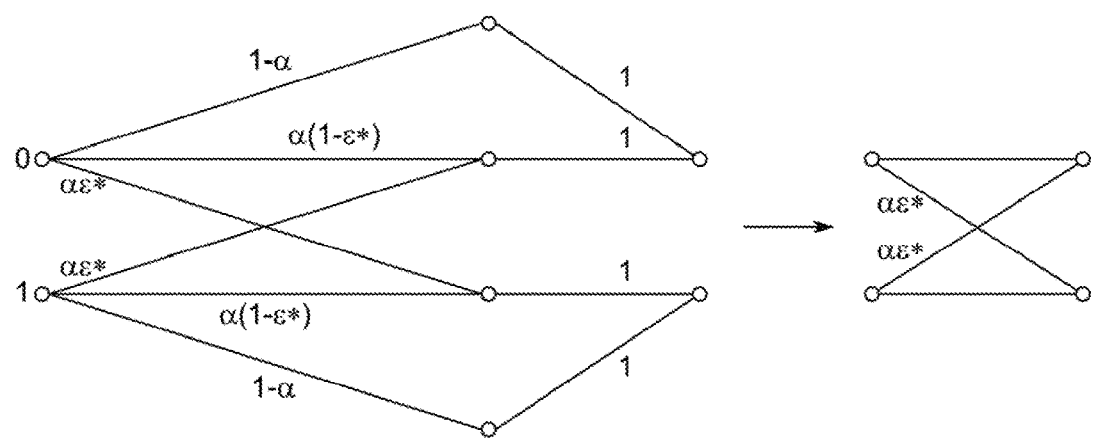
FIG. 8 illustrates an example of: Degrading the channel WOM($\alpha,\varepsilon^*$) to BSC($\alpha\varepsilon^*$). The two channels on the left and on the right may be equivalent.

(3) In FIG. 8, by setting $\varepsilon^* = \varepsilon$, it is seen that $BSC(\alpha\varepsilon) \leq WOM(\alpha,\varepsilon)$. Therefore $F_{WOM(\alpha,\varepsilon)} \subseteq F_{BSC(\alpha\varepsilon)}$.

(4) Since $p \leq \alpha\varepsilon$, clearly $BSC(\alpha\varepsilon) \leq BSC(p)$. Therefore $F_{BSC(p)} \subseteq F_{BSC(\alpha\varepsilon)}$.

The meaning of Lemma 2 is illustrated in FIG. 10.

Lemma 3.

When $p \leq \alpha\varepsilon$, $$\lim_{N \to \infty} \frac{|F_{WOM(\alpha\varepsilon)} \cap F_{BSC(p)}|}{N} \geq \lim_{N \to \infty} \frac{\left|F_{WOM(\alpha,\frac{p}{\alpha})}\right|}{N} = \alpha H\left(\frac{p}{\alpha}\right).$$

Lemma 4.

When $p \leq \alpha\varepsilon$, $$\lim_{N \to \infty} \frac{|F_{WOM(\alpha,\varepsilon)} \cap F_{BSC(p)}|}{N} \geq$$

$$\lim_{N \to \infty} \frac{|F_{WOM(\alpha,\varepsilon)}| + |F_{BSC(p)}| - |F_{BSC(\alpha\varepsilon)}|}{N} = \alpha H(\varepsilon) + H(p) - H(\alpha\varepsilon).$$

Proof: $|F_{WOM(\alpha,\varepsilon)} \cap F_{BSC(p)}| = |F_{WOM(\alpha,\varepsilon)}| + |F_{BSC(p)}| - |F_{WOM(\alpha,\varepsilon)} \cup F_{BSC(p)}| \geq |F_{WOM(\alpha,\varepsilon)}| + |F_{BSC(p)}| - |F_{BSC(\alpha,\varepsilon)}|$ (by Lemma 2).

C. Lower Bound to Sum-Rate

The sum-rate of the general code construction is analyzed as $N \to \infty$. Let $$x_j \triangleq \frac{|F_{WOM(\alpha_{j-1},\varepsilon_j)} \cap F_{BSC(p)}|}{|F_{BSC(p)}|} \leq 1.$$

For j=1, 2, . . . , t, the number of bits written in the j-th rewrite is $$\mathcal{M}_j = |F_{WOM(\alpha_{j-1},\varepsilon_j)}| - |F_{WOM(\alpha_{j-1},\varepsilon_j)} \cap F_{BSC(p)}|$$

$$= N\alpha_{j-1}H(\varepsilon_j) - x_j|F_{BSC(p)}|$$

$$= N(\alpha_{j-1}H(\varepsilon_j) - x_jH(p))$$

and the number of additional cells used to store the bits in $F_{BSC(p)} - F_{WOM(\alpha_{j-1},\varepsilon_j)}$ is $$N_{additional,j} = \frac{NH(p)(1-x_j)}{1-H(p)}$$

Therefore, the sum-rate is $$R_{sum} \triangleq \frac{\sum_{j=1}^{t} \mathcal{M}_j}{N + \sum_{j=1}^{t} N_{additional,j}}$$

$$= \frac{\sum_{j=1}^{t} \alpha_{j-1} H(\varepsilon_j) - H(p) \sum_{j=1}^{t} x_j}{1 + \frac{H(p)}{1-H(p)} \sum_{j=1}^{t} (1-x_j)}$$

$$= \frac{(1-H(p)) \sum_{j=1}^{t} \alpha_{j-1} H(\varepsilon_j) - H(p)(1-H(p)) \sum_{j=1}^{t} x_j}{(1-H(p)+H(p)t) - H(p)\sum_{j=1}^{t} x_j}$$

$$= (1-H(p)) \cdot \frac{\frac{1}{H(p)} \sum_{j=1}^{t} \alpha_{j-1} H(\varepsilon_j) - \sum_{j=1}^{t} x_j}{\frac{1-H(p)+H(p)t}{H(p)} - \sum_{j=1}^{t} x_j}.$$

Let $\gamma_i \triangleq \max\left\{\frac{\alpha_{j-1} H\left(\frac{p}{\alpha_{j-1}}\right)}{H(p)}, \frac{\alpha_{j-1} H(\varepsilon_j) + H(p) - H(\alpha_{j-1}\varepsilon_j)}{H(p)}\right\}.$ Lemma 5. Let $0 < p \leq \alpha_{j-1}\varepsilon_j$. Then $x_j \geq \gamma_j$.
Proof: By Lemma 3, $$x_j = \frac{|F_{WOM(\alpha_{j-1},\varepsilon_j)} \cap F_{BSC(p)}|}{|F_{BSC(p)}|}$$

$$\geq \frac{\left|F_{WOM\left(\alpha_{j-1} \cdot \frac{p}{\alpha_{j-1}}\right)}\right|}{|F_{BSC(p)}|} = \frac{\alpha_{j-1} H\left(\frac{p}{\alpha_{j-1}}\right)}{H(p)}.$$

By Lemma 4, we also have $$x_j = \frac{|F_{WOM(\alpha_{j-1},\varepsilon_j)} \cap F_{BSC(p)}|}{|F_{BSC(p)}|}$$

$$\geq \frac{|F_{WOM(\alpha_{j-1},\varepsilon_j)}| + |F_{BSC(p)}| - |F_{BSC(\alpha_{j-1},\varepsilon_j)}|}{|F_{BSC(p)}|}$$

$$= \frac{\alpha_{j-1} H(\varepsilon_j) + H(p) - H(\alpha_{j-1}\varepsilon_j)}{H(p)}.$$

Theorem 6 Let $0 < p \leq \alpha_{j-1}\varepsilon_j$ for $j=1, 2, \ldots, t$. If $\sum_{j=1}^{t} \alpha_{j-1} H(\varepsilon_j) \geq 1 - H(p) + H(p)t$, then the sum-rate $R_{sum}$ is lower bounded by $$(1-H(p)) \frac{\sum_{j=1}^{t} (\alpha_{j-1} H(\varepsilon_j) - H(p)\gamma_j)}{1 - H(p) + H(p)t - H(p)\sum_{j=1}^{t} \gamma_j}.$$

If $\sum_{j=1}^{t} \alpha_{j-1} H(\varepsilon_j) < 1 - H(p) + H(p)t$, and $H(p) \leq \alpha_{j-1} H(\varepsilon_j)$ for $j=1, 2, \ldots, t$, then $R_{sum}$ is lower bounded by $$(\sum_{j=1}^{t} \alpha_{j-1} H(\varepsilon_j)) - H(p)t.$$

Proof: If $\sum_{j=1}^{t} \alpha_{j-1} H(\varepsilon_j) \geq 1 - H(p) + H(p)t$, the sum-rate is minimized when $x_j$ ($j=1, 2, \ldots, t$) takes the minimum value, and $x_j \geq \gamma_j$. Otherwise, the sum-rate is minimized when $x_j$ takes the maximum value 1.

Some numerical results of the lower bound are shown to sum-rate $R_{sum}$ in FIG. 11, where $$\varepsilon_i = \frac{1}{2+t-i}.$$

The curve for $p=0$ is the optimal sum-rate for noiseless WOM code. The other four curves are the lower bounds for noisy WOM with $p=0.001$, $p=0.005$, $p=0.010$ and $p=0.016$, respectively, given by Theorem 6. Note that it is possible to further increase the lower bound values by optimizing $\varepsilon_t$.

V. Extensions

More general noise models are now described. For simplicity, an erasure channel is described. But the principles or other features can be extended to other noise models. Let the noise be a binary erasure channel (BEC) with erasure probability p, denoted by BEC(p). After a rewrite, noise may appear in some cell levels (both level 0 and level 1) and may change the cell levels to erasures. An erasure represents a noisy cell level between 0 and 1. Erasures may be handled as follows: before a rewrite, all the erased cell levels are increased to 1, and then rewriting is performed as before.

Note that although the noise for cell levels is BEC(p), when rewriting happens, the equivalent noise channel for the cell value $v = s \oplus g$ is a $$BSC\left(\frac{p}{2}\right),$$

because all the erased cell levels have been pushed to level 1, and dither has a uniform distribution. Therefore, the code construction and its performance analysis can be carried out the same way as before, except that p is replaced by $$\frac{p}{2}.$$

The code can also be extended to multi-level cells (MLC), by using q-ary polar codes.

VI. Additional Information

In this section, example achievable rates of the error correcting WOM code are discussed, using polar codes of finite lengths. In the following, assume the noise channel is BSC(p), and search is performed for parameters $\varepsilon_1, \varepsilon_2, \ldots, \varepsilon_t$ that achieve high sum-rate for rewriting. When the code can have a nested structure is also discussed. This simplifies the code construction.

A. Finding BSCs Satisfying $F_{BSC(p)} \subseteq F_{WOM(\alpha,\varepsilon)}$

The first consideration is when BSC(p) satisfies the condition $F_{BSC(p)} \subseteq F_{WOM(\alpha,\varepsilon)}$, which leads to a particular nested code structure. Let N=8192. Let the polar codes be constructed using the method(s) described herein. To obtain the frozen sets, let $|F_{WOM(\alpha,\varepsilon)}| = N(\alpha H(\varepsilon) - \Delta R)$, where $\Delta R = 0.025$ is a rate loss considered for the polar code of the WOM channel, and let $F_{BSC(p)}$ be chosen with the target block error rate $10^{-5}$.

Example results are shown in FIG. 12. The four curves correspond to $\alpha=0.4$, 0.6, 0.8, and 1.0, respectively. The x-axis is $\varepsilon$, and the y-axis is the maximum value of p that satisfies $F_{BSC(p)} \subseteq F_{WOM(\alpha,\varepsilon)}$. Clearly, the maximum value of p increases with both α and ε and has nontrivial values (namely, p is comparable to or higher than the typical error probabilities in memories).

B. Achievable Sum-Rates for Nested Code

Achievable sum-rates of codes with a nested structure may be found. Accordingly, the condition $F_{BSC(p)} \subseteq F_{WOM(\alpha_{j-1}, \varepsilon_j)}$ may be satisfied for all j=1, 2, . . . , t. Given p, $\varepsilon_1, \varepsilon_2, \ldots, \varepsilon_t$ that maximize or otherwise increase the sum-rate $R_{sum}$ may be found.

Results for t-write error-correcting WOM codes—for t=2,3,4,5—are shown in FIG. 13. (In one example, let N=8192, ΔR=0.025, and the target block error rate be $10^{-5}$.) The x-axis is p and the y-axis is the maximum sum-rate found in the algorithmic search. Accordingly, the achievable sum-rate increases with the number of rewrites t.

C. Achievable Sum-Rate for General Code

The achievable sum-rates of the general code, when $F_{BSC(p)}$ is not necessarily a subset of $F_{WOM(\alpha_{j-1}, \varepsilon_j)}$, is now described. When p is given, the general code can search a larger solution space for $\varepsilon_1, \varepsilon_2, \ldots, \varepsilon_t$ than the nested-code case, and therefore achieve higher sum-rates. However, for relatively small p (e.g. p<0.016), the gain in rate that is obtained may be quite small. This indicates that the nested code is already performing well for this parameter range.

The lower bound to sum-rate $R_{sum}$ is discussed with reference to FIG. 10. of Note that one embodiment may actually be higher than the rates found in other embodiments. This is because the lower bound is for N→∞, while the codes in the other embodiments may be still short so far and may consider the rate loss ΔR. Better rates can be provided as the code length is increased and as the search algorithm is further improved due to the results indicated by the lower bound.

VII. Additional Example Embodiments

FIG. 14 is an illustration of one embodiment of a data device constructed/configured so as to perform the methods and operations discussed herein. FIG. 14 shows a memory 1602 that is accessed by a memory controller 1604 that communicates with a host device 1606. The memory 1602 is used for storing data that is represented in accordance with an encoding and decoding scheme discussed herein. The memory may be implemented, for example, as a Flash memory having multilevel cells. The memory 1602 and memory controller 1604 together at least partly form a data storage device 1608 that may be external to the host device or may be integrated with the host device into a single component or system. For example, the data storage device 1608 may comprise a Flash memory device (often referred to as a "thumb drive") that communicates with a host computer 1606 via a USB connection, or the data storage device may comprise a solid state drive (SSD) that stores data for a host computer system. Alternatively, the data storage device may integrated with a suitable host device to comprise a single system or component with memory employing an embodiment of a encoding and decoding scheme as discussed herein, such as a smart phone, network router, MP3 player, or the like.

The memory controller 1604 operates under control of a microcontroller 1610, which manages communications with the memory 1602 via a write device, such as memory interface 1612 and manages communications with the host device via a host interface 1614. Thus, the memory controller supervises data transfers from the host 1606 to the memory 1602 and from the memory 1602 to the host 1606. The memory controller 1604 also includes a data buffer 1616 in which data values may be temporarily stored for transmission over the data channel controller 1617 between the memory 1602 and the host 1606. They memory controller also includes an Error Correcting code (ECC) block 1618 in which data for the ECC is maintained. For example, the ECC block 1618 may comprise data and program code to perform error correction operations for a an embodiment of a encoding and decoding scheme as discussed herein. Some embodiments of such error correction operations are described, for example, in U.S. Patent Application entitled "Error Correcting Codes for Rank Modulation" by Anxiao Jiang et al. filed Nov. 20, 2008, and incorporated herein by reference. The ECC block 1618 may contain parameters for the error correction code to be used for the memory 1602, such as programmed operations for translating between received symbols and error-corrected symbols, or the ECC block may contain lookup tables for codewords or other data, or the like. The memory controller 1604 of one embodiment may perform the operations described above for decoding data and for encoding data.

The operations described above for operating a data storage device, for reading data from a device, for programming a data storage device, and encoding and decoding, can be carried out by the operations discussed above which can be performed by the microcontroller 1610 and associated components of the data storage device 1608.

The processing components such as the controller 1604 and microcontroller 1610 to perform the various operations described herein may be implemented in some embodiments in the form of control logic in software (or other computer-readable instruction stored on a non-transitory computer-readable storage medium and executable by one or more processors) or hardware or a combination of both, and may comprise the processor(s) that execute software program instructions from program memory, or as firmware, or the like. The host device 1606 may comprise a computer apparatus. A computer apparatus also may carry out the operations depicted in the various figures herein or otherwise described above.

FIG. 15 is a block diagram illustrating an example computing device 900 that includes elements that pertain to the encoding and decoding operations, error correction operation, memory cells, etc. discussed herein in connection with a read and write data from a memory. In a very basic configuration 901, computing device 900 typically includes one or more processors 910 and system memory 920. A memory bus 930 can be used for communicating between the processor 910 and the system memory 920.

Depending on the desired configuration, processor 910 can be of any type including but not limited to a microprocessor (μP), a microcontroller (μC), a digital signal processor (DSP), or any combination thereof. Processor 910 can include one more levels of caching, such as a level one cache 911 and a level two cache 912, a processor core 913, and registers 914. The processor core 913 can include an arithmetic logic unit (ALU), a floating point unit (FPU), a digital signal processing core (DSP Core), or any combination thereof. A memory controller 915 can also be used with the processor 910, or in some implementations the memory controller 915 can be an internal part of the processor 910.

Depending on the desired configuration, the system memory 920 can be of any type including but not limited to volatile memory (such as RAM), non-volatile memory (such as ROM, flash memory, etc.) or any combination thereof. System memory 920 typically includes an operating system 921, one or more applications 922, and program data 924. Applications 922 include encoding and decoding algorithms 923 that is arranged to encode and decode, for example, program data 924 as discussed below. In some embodiments, applications 922 can be arranged to operate with program data 924 on an operating system 921. This described basic configuration is illustrated in FIG. 9 by those components within dashed line 901. In some embodiments, one or more of the memories or other storage devices shown in FIG. 15 can include WOM that is written to and read from using the various features and operations described above. In some embodiments, the applications(s) 922 can include one or more algorithms 923 having computer-readable instructions that are stored on a non-transitory (such as hardware) computer-readable medium and that are executable by one or more processors (such as the processor 910) to perform the joint rewriting and error correction of a WOM as described herein. The program data 924 of one embodiment may include various data 925, such as the data written to or read from the WOM, the data for the various equations/variable/vectors/algorithms/etc. described above, or other data.

Computing device 900 can have additional features or functionality, and additional interfaces to facilitate communications between the basic configuration 901 and any required devices and interfaces. For example, a bus/interface controller 940 can be used to facilitate communications in accordance with the present disclosure between the basic configuration 901 and one or more data storage devices 950 via a storage interface bus 941. The data storage devices 950 can be removable storage devices 951, non-removable storage devices 952, or a combination thereof. Examples of removable storage and non-removable storage devices include magnetic disk devices such as flexible disk drives and hard-disk drives (HHDs), optical disk drives such as compact disk (CD) drives or digital versatile disk (DVD) drives, solid state drives (SSDs), and tape drives to name a few. Example computer storage media can include volatile and nonvolatile, removable and non-removable media implemented in any method or technology for storage of information, such as computer readable instructions, data structures, program modules, or other data.

System memory 920, removable storage 951 and non-removable storage 952 are all examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which can be used to store the desired information and which can be accessed by computing device 900. Any such computer storage media can be part of device 900.

Computing device 900 can also include an interface bus 942 for facilitating communication from various interface devices (e.g., output interfaces, peripheral interfaces, and communication interfaces) to the basic configuration 901 via the bus/interface controller 940. Example output devices 960 include a graphics processing unit 961 and an audio processing unit 962, which can be configured to communicate to various external devices such as a display or speakers via one or more A/V ports 963. Example peripheral interfaces 970 include a serial Interface controller 971 or a parallel interlace controller 972, which can be configured to communicate with external devices such as input devices (e.g., keyboard, mouse, pen, voice input device, touch input device, etc.) or other peripheral devices (e.g. printer, scanner, etc.) via one or more I/O ports 973. An example communication device 980 includes a network controller 981, which can be arranged to facilitate communications with one or more other computing devices 990 over a network communication via one or more communication ports 982. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 900 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 900 can also be implemented as a personal computer including both laptop computer and non-laptop computer configurations.

The operations of encoding and decoding data according to the error correction encoding schemes discussed above can be illustrated ad in FIG. 16, which shows data flow in a memory device 1302, such as data storage device 1608 discussed above with reference to FIG. 14, that operates according to the error correction encoding schemes described herein. In FIG. 16, the memory device 1302 includes an encoder and decoder 1308 for encoding data values into codewords and decoding codewords into data values. The encoder and decoder 1308 encodes data values and provides codewords to the source/destination block 1310, and decodes codewords from the source/destination and provides corresponding data values. The two-way nature of the data flow is indicated by the double-ended arrows labeled "data values" and "codewords". The encoder and decoder 1308 includes interfaces through which the encoder and decoder 1308 receives and provides the data values and the information values (codewords). For the sake of brevity, further details of such interfaces are not provided herein. While represented as a single block/unit that is labeled as 1308 in FIG. 16, the encoder and decoder can comprise discrete and separate blocks/units in other embodiments.

The information values 1306 comprise a physical representation of the data values and codewords. For example, the information values 1306 may represent charge levels of memory cells, such that multiple cells are configured to operate as virtual cell in which charge levels of the cells determine a representation of the data values with error correction. Data values are received and encoded to represent the data values with error correction and charge levels of cells are adjusted accordingly, and codewords are determined according to cell charge levels, from which a corresponding data value is determined. Alternatively, the information values 1306 may represent features of a transmitted signal, such as signal frequency, magnitude, or duration, such that the cells or bins are defined by the signal features and represent a data value having error correction. For example, frequency changes over time can determine a data value having error correction. Other schemes for physical representation of the cells are possible in view of the description herein.

For information values 1306 in the case of cell charge levels, the source/destination 1310 comprises memory cells in which n memory cells provide n cell values whose charge levels define data values having error correction. For storing a codeword, the memory cells receive an encoded codeword and comprise a destination, and for reading a code word, the memory cells provide a codeword for decoding and comprise a source. In the case of data transmission, the source/destination 1310 may comprise a write device, such as a transmitter/receiver that processes a signal with signal features such as frequency, magnitude, or duration that define cells or bins such that the signal features determine a data value having error correction. For example, signal components comprising signal frequency, magnitude, or duration may be controlled and modulated by the transmitter such that data values having error correction are represented. When the source/destination 1310 receives a codeword from the controller 1304, the source/destination comprises a transmitter of the device 1302 for sending an encoded signal. When the source/destination provides a codeword to the controller 1304 from a received signal, the source/destination comprises a receiver of the device for receiving an encoded signal. Signal components of the transmitted signal can be suitable modulated to define data values having error correction, in view of the description herein.

The various aspects discussed herein can be implemented in the form of control logic in software or hardware or a combination of both. The control logic may be stored in an information storage medium as a plurality of instructions adapted to direct an information-processing device to perform the operations discussed herein. Based on the disclosure and teachings provided herein, other ways and/or methods to implement the discussed features are possible.

The methods and operations described herein can be implemented in a variety of systems for encoding and decoding data for transmission and storage. For example, codewords may be received from a source over an information channel according to a memory writing scheme and are decoded into their corresponding data values and provided to a destination, such as a memory or a processor, and data values for storage or transmission are received from a source over an information channel and are encoded according to the memory writing scheme.

The coding scheme can be further extended to multi-level cells (MLC). For example, using aspects of the coding scheme described above, multilevel cell memories can be written level by level. Alternatively or additionally, aspects of the coding scheme described above may be used for writing multilevel cell memories using a multilevel polar code.

VIII. Concluding Remarks

This application presents a code construction for error-correcting WOM codes. The embodiment(s) described herein supports any number of rewrites and can correct a substantial number of errors. In some embodiments, construction may be based on polar coding to achieve improved performance for both rewriting and error correction.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, systems, or devices which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases, "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A along, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A along, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A and B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to oranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, and 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method to rewrite a memory, the method comprising:
   determining respective current cell charge levels of a plurality of cells of the memory;
   generating a plurality of next cell charge levels for the plurality of cells according to a linear transformation that includes a multiplication of an input vector that includes input data, by a matrix of N rows and N columns, wherein each next cell charge level is generated based on a corresponding one of the current cell charge levels, the input data, and additional data that includes a frozen set of a binary symmetric channel (BSC), wherein each next cell charge level is greater than or equal to the corresponding one of the current cell charge levels, wherein the plurality of next cell charge levels represent the input data, and wherein the plurality of next cell charge levels include redundancy for error correction; and
   storing the plurality of next cell charge levels, which include the redundancy for error correction, in the memory, to enable rewriting of the memory without decrease in the current cell charge levels, wherein the redundancy for error correction enables recovery of most recently written data when noise changes a level of one or more cells, of the plurality of cells, which contain the most recently written data.

2. The method of claim 1, wherein generating the plurality of next cell charge levels according to the linear transformation comprises:
   generating a first subset of bits of the input vector which are equal to a value of the input data, and a second subset of bits of the input vector which are equal to a constant.

3. A method to rewrite a memory, the method comprising:
   determining respective current cell charge levels of a plurality of cells of the memory;
   generating a plurality of next cell charge levels for the plurality of cells according to a linear transformation that includes a multiplication of an input vector that includes input data, by a matrix of N rows and N columns, wherein each next cell charge level is generated based on a corresponding one of the current cell charge levels and based on the input data, wherein each next cell charge level is greater than or equal to the corresponding one of the current cell charge levels, wherein the plurality of next cell charge levels represent the input data, wherein the plurality of next cell charge levels include redundancy for error correction, and wherein generating the plurality of next cell charge levels comprises:
      generating a first subset of bits of the input vector which are equal to a value of the input data, and a second subset of bits of the input vector which are equal to a constant; and
      indexing bits of the input vector such that each bit of the input vector has an index that indicates a position within an order of the bits of the input vector, wherein the bits of the first subset of the input vector have indices in a dataset that is based on a first dataset and a second dataset, wherein the bits of the second subset of the input vector have indices in the second dataset, wherein the second dataset includes at least one element, wherein the first dataset includes elements which are absent in the second dataset, wherein at least one index is in neither the first dataset nor the second dataset, and wherein the second dataset is a subset of the first dataset; and
   storing the plurality of next cell charge levels, which include the redundancy for error correction, in the memory, to enable rewriting of the memory without decrease in the current cell charge levels, and wherein the redundancy for error correction enables recovery of most recently written data when noise changes a level of one or more cells, of the plurality of cells, which contain the most recently written data.

4. The method of claim 3, wherein generating the plurality of next cell charge levels according to the linear transformation further comprises:
   calculating a plurality of before write values, wherein each of the plurality of before write values is calculated based on a corresponding current cell charge level and on a corresponding dither value of a plurality of dither values, and wherein each of the plurality of before write values is equal to the corresponding current cell charge level exclusive OR-ed (XOR-ed) with the corresponding dither value; and
   calculating a plurality of after write values, wherein each of the plurality of after write values is calculated based on the corresponding next cell charge level and the corresponding dither value of the plurality of dither values, and wherein each of the plurality of after write values is equal to the corresponding next cell charge level XOR-ed with the corresponding dither value.

5. The method of claim 4, wherein the plurality of after write values is equal to the input vector multiplied by the matrix, and wherein the plurality of next cell charge levels is equal to a bit-wise XOR of the plurality of after write values and the plurality of dither values.

6. The method of claim 4, wherein the plurality of dither values includes a plurality of pseudo-random numbers.

7. The method of claim 3, wherein generating the plurality of next cell charge levels according to the linear transformation comprises generating the bits of the input vector according to a linear transformation that includes calculation of the bits in the input vector having an index which is in neither the first dataset nor the second dataset.

8. The method of claim 3, wherein the matrix includes a generating matrix of a polar code, and wherein the first dataset is in a frozen set of the polar code.

9. A method to read a memory, the method comprising:
   determining respective current cell charge levels of a plurality of cells of the memory, wherein the current cell charge levels represent data and error correction information;
   generating a plurality of data values for the plurality of cells, by use of an error correction function, from the current cell charge levels, wherein the plurality of data values are generated according to a linear transformation that includes a multiplication of an input vector by a matrix of N rows and N columns, and wherein the input vector comprises a first subset of bits which correspond to the plurality of data values, and a second subset of bits which are equal to a constant;
   indexing bits of the input vector such that each bit has an index that indicates a position within the input vector, wherein the first subset of bits have indices in a dataset that is based on a first dataset and a second dataset, wherein the second subset of bits have indices in the second dataset, wherein the second dataset includes at least one element, wherein the first dataset includes elements which are absent in the second dataset, wherein at least one index is in neither the first dataset nor the second dataset, and wherein the second dataset is a subset of the first dataset; and
   transmitting the plurality of data values to a data destination, wherein the transmitted plurality of data values, generated by use of the error correction function, facilitates recovery of most recently written data to the memory when noise changes a level of one or more cells, of the plurality of cells, which contain the most recently written data.

10. The method of claim 9, wherein the input vector equals a bit-wise XOR of the current cell charge levels and a plurality of dither values.

11. The method of claim 9, wherein the multiplication of the input vector by the matrix includes a multiplication of the input vector by an inverse of a generating matrix of a polar code.

12. The method of claim 9, wherein the current cell charge levels define an error correction code that pertains to the error correction information, and wherein generating the plurality of data values comprises:
   determining a set of data values; and
   verifying that the set of data values is consistent with the error correction code.

13. A memory system, comprising:
   a memory that includes a plurality of cells;
   a processor coupled to the memory and configured to determine respective current cell charge levels of the plurality of cells of the memory;
   an encoder coupled to the memory and to the processor, and configured to:
      generate a plurality of next cell charge levels according to a linear transformation that includes a multiplication of an input vector that includes input data, by a matrix of N rows and N columns, wherein each next cell charge level is generated based on a corresponding one of the current cell charge levels and based on the input data, wherein each next cell charge level is greater than or equal to the corresponding one of the current cell charge levels, wherein the plurality of next cell charge levels represent the input data, wherein the plurality of next cell charge levels include redundancy for error correction, wherein the input vector includes bits, and wherein a first subset of bits of the input vector are equal to a value of the input data, and a second subset of bits of the input vector are equal to a constant; and
      index the bits of the input vector such that each bit has an index that indicates a position within an order of bits, wherein the bits of the first subset have indices in a dataset that is based on a first dataset and a second dataset, wherein the bits of the second subset have indices in the second dataset, wherein the second dataset includes at least one element, wherein the first dataset includes elements which are absent in the second dataset, wherein at least one index is in neither the first dataset nor the second dataset, and wherein the second dataset is a subset of the first dataset; and
   a write device coupled to the encoder and to the memory, and configured to store the plurality of next cell charge levels, which include the redundancy for error correction, in corresponding cells of the plurality of cells of the memory, to enable rewriting of the memory without decrease in the current cell charge levels, and wherein the redundancy for error correction enables recovery of most recently written data when noise changes a level of one or more cells, of the plurality of cells, which contain the most recently written data.

14. The system of claim 13, wherein the linear transformation comprises:
   a calculation of a plurality of before write values, wherein each of the plurality of before write values is calculated based on a corresponding current cell charge level and on a corresponding dither value of a plurality of dither values, and wherein each of the plurality of before write values is equal to the corresponding current cell charge level exclusive OR-ed (XOR-ed) with the corresponding dither value; and
   a calculation of a plurality of after write values, wherein each of the plurality of after write values is calculated based on a corresponding next cell charge level and the corresponding dither value, and wherein each of the plurality of after write values is equal to the corresponding next cell charge level XOR-ed with the corresponding dither value.

15. The system of claim 14, wherein the plurality of after write values is equal to the input vector multiplied by the matrix, and wherein the plurality of next cell charge levels is equal to the bit-wise XOR of the plurality of after write values and the plurality of dither values.

16. The system of claim 14, wherein the plurality of dither values includes a plurality of pseudo-random numbers.

17. The system of claim 13, wherein the linear transformation comprises a calculation of the input vector having an index which is in neither the first dataset nor the second dataset.

18. The system of claim 13, wherein the matrix includes a generating matrix of a polar code, and wherein the first dataset is in a frozen set of the polar code.

19. A memory system, comprising:
a memory that includes a plurality of cells;
a processor coupled to the memory and configured to determine respective current cell charge levels of the plurality of cells of the memory, wherein the current cell charge levels represent data and error correction information;
a decoder coupled to the processor and to the memory, and configured to:
generate a plurality of data values for the plurality of cells from the current cell charge levels by use of an error correction function, wherein the plurality of data values for the plurality of cells are generated according to a linear transformation that includes a multiplication of an input vector by a matrix of N rows and N columns, wherein the input vector comprises a first subset of bits which correspond to the plurality of data values, and a second subset of bits which are equal to a constant; and
index bits of the input vector such that each bit has an index that indicates a position within the input vector, wherein the first subset of bits have indices in a dataset that is based on a first dataset and a second dataset, wherein the second subset of bits have indices in the second dataset, wherein the second dataset includes at least one element, wherein the first dataset includes elements which are absent in the second dataset, wherein at least one index is in neither the first dataset nor the second dataset, and wherein the second dataset is a subset of the first dataset; and
a transmitter coupled the decoder and configured to transmit the plurality of data values to a data destination, wherein the transmitted plurality of data values, generated by use of the error correction function, facilitates recovery of most recently written data to the memory when noise changes a level of one or more cells, of the plurality of cells, which contain the most recently written data.

20. The system of claim 19, wherein the matrix is equal to a m-th Kronecker product of $G_2$, wherein $$G_2 = \begin{pmatrix} 1 & 0 \\ 1 & 1 \end{pmatrix},$$

and $N=2^m$.

21. The system of claim 19, wherein the matrix includes a generating matrix of a polar code.

22. The system of claim 19, wherein the linear transformation implements one of a list-decoding algorithm and a belief-propagation algorithm.

23. The system of claim 19, wherein the data and the error correction information of the current cell charge levels are encoded such that a bit-wise XOR of the current cell charge levels and a plurality of dither values equals the input vector, and wherein the input vector includes a first subset of positions that represent the data, and a second subset of subset having constant values.

24. The system of claim 19, further comprising a bus coupled between the memory and the processor.

25. The method of claim 1, wherein the matrix is equal to a m-th Kronecker product of $G_2$, wherein $$G_2 = \begin{pmatrix} 1 & 0 \\ 1 & 1 \end{pmatrix},$$

and $N=2^m$.

* * * * *